US012790458B2

(12) United States Patent
Bajaj et al.

(10) Patent No.: US 12,790,458 B2
(45) Date of Patent: Nov. 10, 2026

(54) POLYMER-CERAMIC COMPOSITE HOUSINGS AND HOUSING COMPONENTS FOR PORTABLE ELECTRONIC DEVICES

(71) Applicant: SHPP Global Technologies B.V., Bergen op Zoom (NL)

(72) Inventors: Devendra Narayandas Bajaj, Evansville, IN (US); Chiel Albertus Leenders, Bergen op Zoom (NL); Gabriel Julianus Maria Hoogland, Bergen op Zoom (NL); Viswanathan Kalyanaraman, Newburgh, IN (US); Cameron Youngstrom, Washington, WV (US)

(73) Assignee: SHPP Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 17/754,691

(22) PCT Filed: Oct. 9, 2020

(86) PCT No.: PCT/IB2020/059515

§ 371 (c)(1),
(2) Date: Apr. 8, 2022

(87) PCT Pub. No.: WO2021/070138

PCT Pub. Date: Apr. 15, 2021

(65) Prior Publication Data

US 2022/0411602 A1 Dec. 29, 2022

Related U.S. Application Data

(60) Provisional application No. 62/914,278, filed on Oct. 11, 2019.

(30) Foreign Application Priority Data

Feb. 14, 2020 (EP) .................................... 20157480

(51) Int. Cl.
*C08K 3/22* (2006.01)
*B29C 45/00* (2006.01)
(Continued)

(52) U.S. Cl.
CPC ............ *C08K 3/22* (2013.01); *B29C 45/0013* (2013.01); *B29C 45/0053* (2013.01);
(Continued)

(58) Field of Classification Search
CPC .... C08K 2003/2227; C08K 2003/2244; C08K 2003/2272; C08K 2003/2275;
(Continued)

(56) References Cited

U.S. PATENT DOCUMENTS 3,257,357 A 6/1966 Stamatoff
3,257,358 A 6/1966 Stamatoff
(Continued)

FOREIGN PATENT DOCUMENTS

CA 2304361 4/1999
CN 1564721 1/2005
(Continued)

OTHER PUBLICATIONS

Handge et al., "Viscoelastic and dielectric properties of composites of poly(vinyl butyral) and alumina particles with a high filling degree," *Polymer* 82 (2016) 337-348.
(Continued)

*Primary Examiner* — Kregg T Brooks
(74) *Attorney, Agent, or Firm* — Norton Rose Fulbright US LLP

(57) ABSTRACT

Housing parts for a portable electronic devices, and methods of molding such housing parts for portable electronic devices. Such housing parts comprise: a housing component comprising ceramic particles in a polymer matrix, the
(Continued)

ceramic particles comprising from 50% to 90% by volume of the housing component, and the polymer matrix comprising from 10% to 50% by volume of the housing component; the ceramic particles have a Dv50 of from 50 nanometers to 100 micrometers; the ceramic particles are substantially free of agglomeration; the housing component has a relative density greater than 90%; and the housing component is configured to cover a portion of a portable electronic device. The present methods of molding such housing parts comprise: disposing polymer-ceramic core-shell particles in a working portion of a cavity in a mold, each of the core-shell particles comprising a ceramic core comprising a particle of a ceramic, and a polymer shell around the core, the shell comprising a polymer, where the ceramic cores comprise from 50% to 90% by volume of the powder, and the polymer shells comprising from 10% to 50% by volume of the powder; heating the mold to a first temperature that exceeds a melting temperature (Tm) of the first polymer; subjecting the powder in the mold to a first pressure while maintaining the temperature of the mold to or above the first temperature to define a housing component in which the ceramic particles are substantially free of agglomeration; cooling the housing component to a temperature below the Tg or Tm of the first polymer; and removing the housing component from the mold. In such housing parts and methods, the ceramic particles comprise $Al_2O_3$, $Fe_3O_4$, $Fe_2O_3$, ZnO, $ZrO_2$, $SiO_2$, and/or a combination of any two or more of these ceramics; and the polymer comprises PPE, PPS, PC copolymers, PEI, PEI copolymers, PPSU, PAES, PES, PAEK, PBT, PP, PE, semi-crystalline PI, or semi-crystalline polyamide.

10 Claims, 21 Drawing Sheets

(51) Int. Cl.

| | |
|---|---|
| ***B29C 45/16*** | (2006.01) |
| ***B29C 45/72*** | (2006.01) |
| ***B29K 509/02*** | (2006.01) |
| ***B29L 31/34*** | (2006.01) |
| ***B32B 5/12*** | (2006.01) |
| ***B32B 5/26*** | (2006.01) |
| ***C08K 3/36*** | (2006.01) |
| ***H05K 5/00*** | (2025.01) |
| ***H05K 5/02*** | (2006.01) |

(52) U.S. Cl.
CPC .......... *B29C 45/16* (2013.01); *B29C 45/7207* (2013.01); *B32B 5/12* (2013.01); *B32B 5/26* (2013.01); *C08K 3/36* (2013.01); *H05K 5/0034* (2013.01); *H05K 5/0217* (2013.01); *B29K 2509/02* (2013.01); *B29L 2031/34* (2013.01); *B32B 2260/023* (2013.01); *B32B 2260/046* (2013.01); *B32B 2457/00* (2013.01); *C08K 2003/2217* (2013.01); *C08K 2003/2227* (2013.01); *C08K 2003/2244* (2013.01); *C08K 2003/2272* (2013.01); *C08K 2003/2275* (2013.01); *C08K 2003/2296* (2013.01)

(58) Field of Classification Search
CPC .... C08K 2003/2296; C08K 3/36; C08K 3/22; C08K 9/08; C08K 9/10; C08L 71/12; B29C 45/0013; H05K 5/0034; H05K 5/0052; H05K 5/0086
See application file for complete search history.

(56) References Cited

U.S. PATENT DOCUMENTS

| | | | | |
|---|---|---|---|---|
| 3,306,874 | A | 2/1967 | Hay | |
| 3,306,875 | A | 2/1967 | Hay | |
| 3,914,266 | A | 10/1975 | Hay | |
| 4,028,341 | A | 6/1977 | Hay | |
| 4,065,519 | A * | 12/1977 | Koch | B29C 48/288 428/394 |
| 4,769,424 | A | 9/1988 | Takekoshi et al. | |
| 4,806,297 | A | 2/1989 | Brown et al. | |
| 4,806,602 | A | 2/1989 | White et al. | |
| 4,935,472 | A | 6/1990 | Brown et al. | |
| 5,089,566 | A | 2/1992 | Brown et al. | |
| 5,110,855 | A * | 5/1992 | Blatz | B65D 65/38 524/451 |
| 5,464,928 | A * | 11/1995 | Chang | C08G 73/1085 528/229 |
| 5,739,193 | A | 4/1998 | Walpita et al. | |
| 6,518,323 | B1 | 2/2003 | Scheying et al. | |
| 7,595,367 | B2 | 9/2009 | Carillo et al. | |
| 9,691,520 | B2 | 6/2017 | Kim et al. | |
| 2002/0038582 | A1* | 4/2002 | Holl | B29C 67/242 75/230 |
| 2002/0040085 | A1 | 4/2002 | Venigalla | |
| 2003/0092557 | A1 | 5/2003 | Aichele et al. | |
| 2005/0167136 | A1* | 8/2005 | Centofante | H01L 23/544 257/E23.179 |
| 2008/0275162 | A1 | 11/2008 | Schwab et al. | |
| 2010/0010141 | A1* | 1/2010 | Nakamura | C08L 69/00 524/451 |
| 2011/0104435 | A1 | 5/2011 | Wang | |
| 2013/0011660 | A1* | 1/2013 | Diekmann | C04B 35/63468 428/407 |
| 2013/0171416 | A1 | 7/2013 | Diekmann | |
| 2014/0126113 | A1 | 5/2014 | Ogiwara | |
| 2014/0126130 | A1 | 5/2014 | Aurongzeb | |
| 2015/0073101 | A1 | 3/2015 | Kim et al. | |
| 2015/0283791 | A1 | 10/2015 | Yamashita et al. | |
| 2016/0255929 | A1 | 9/2016 | Nazzaro et al. | |
| 2017/0088471 | A1 | 3/2017 | Randall et al. | |
| 2017/0120566 | A1 | 5/2017 | Aldousari et al. | |
| 2018/0202076 | A1 | 7/2018 | Van Der Schaaf et al. | |
| 2018/0346714 | A1 | 12/2018 | Bushelman et al. | |
| 2019/0062219 | A1 | 2/2019 | Ketcham et al. | |
| 2019/0168420 | A1 | 6/2019 | Reese et al. | |
| 2019/0185382 | A1 | 6/2019 | Bolvari et al. | |
| 2019/0352804 | A1 | 11/2019 | Kopping et al. | |
| 2022/0289638 | A1* | 9/2022 | Kalyanaraman | C04B 41/5031 |
| 2022/0289982 | A1* | 9/2022 | Kalyanaraman | B01J 13/04 |

FOREIGN PATENT DOCUMENTS

| | | | |
|---|---|---|---|
| CN | 101054300 | | 10/2007 |
| CN | 101328024 | | 12/2008 |
| CN | 102275983 | | 12/2011 |
| CN | 102325645 | | 1/2012 |
| CN | 102548933 | | 7/2012 |
| CN | 102863224 | | 1/2013 |
| CN | 202956507 | | 5/2013 |
| CN | 202977722 | | 6/2013 |
| CN | 103755848 | | 4/2014 |
| CN | 103764393 | | 7/2014 |
| CN | 104057091 | | 9/2014 |
| CN | 104057092 | | 9/2014 |
| CN | 105381765 | | 3/2016 |
| CN | 105482010 | | 4/2016 |
| CN | 105940044 | A | 9/2016 |
| CN | 106749790 | | 5/2017 |
| CN | 107266082 | | 10/2017 |
| CN | 107286596 | | 10/2017 |
| CN | 107673658 | | 2/2018 |
| CN | 108407164 | | 8/2018 |
| CN | 109890876 | | 6/2019 |
| CN | 105940044 | B | 7/2019 |
| CN | 110140244 | | 8/2019 |
| CN | 110268006 | | 9/2019 |

(56) References Cited

FOREIGN PATENT DOCUMENTS

| | | | | |
|---|---|---|---|---|
| EP | 868732 | | 10/1998 | |
| EP | 2157121 | | 2/2010 | |
| EP | 3555350 | | 10/2019 | |
| JP | H01125338 | | 5/1989 | |
| JP | H 03236930 | A | 10/1991 | |
| JP | H 03236931 | A | 10/1991 | |
| JP | 11345518 | | 12/1999 | |
| JP | 2010/028179 | | 2/2010 | |
| KR | 20100098248 | | 9/2010 | |
| KR | 101796281 | | 11/2017 | |
| KR | 20180127148 | A | 11/2018 | |
| WO | WO 1997/042639 | | 11/1997 | |
| WO | WO-9821272 | A2 * | 5/1998 | ............. C08J 3/215 |
| WO | WO 2014/015674 | | 1/2014 | |
| WO | WO 2015/167069 | | 11/2015 | |
| WO | WO 2017/012119 | | 1/2017 | |
| WO | WO 2017/039634 | | 3/2017 | |
| WO | WO 2017/088471 | | 6/2017 | |
| WO | WO 2017/149086 | | 9/2017 | |
| WO | WO 2018/039619 | | 3/2018 | |
| WO | WO 2018/039628 | | 3/2018 | |
| WO | WO 2018/039634 | | 3/2018 | |
| WO | WO 2018039620 | | 3/2018 | |
| WO | WO 2018/112390 | | 6/2018 | |
| WO | WO 2018/129170 | | 7/2018 | |
| WO | WO 2018/140451 | | 8/2018 | |
| WO | WO 2019/025472 | | 2/2019 | |
| WO | WO 2019/027420 | | 2/2019 | |
| WO | WO 2019/183192 | | 9/2019 | |
| WO | WO 20190193578 | | 10/2019 | |
| WO | WO 2021/059218 | | 5/2021 | |

OTHER PUBLICATIONS

International Search Report and Written Opinion for PCT/IB2020/059515 mailed Jan. 20, 2021.

Arburg GmbH + Co KG, "Powder injection moulding: Cost-effective solutions for metal or ceramic parts", 2016, 12 pages.

Benhadjala W. et al., "Effect of processing factors on dielectric properties of BaTiO3/hyperbranched polyester core-shell nanoparticles," 2013 IEEE 63rd Electronic Components and Technology Conference, 2013, pp. 1767-1772, doi: 10.1109/ECTC2013.6575814.

Brandt, K. et al. "Novel ceramic-polymer composites synthesized by compaction of polymer-encapsulated TiO2-nanoparticles", Composites Science and Technology, 72, pp. 65-71, 2011.

Chiang, C. et al., "Polymer Composites with High Dielectric Constant", Ferroelectrics, vol. 275, pp. 1-9, Dec. 24, 2001.

Edwards, J. "Apple Watch and the story of ceramics", iMore, Apr. 14, 2017. https://www.imore.com/new-star-constellation-ceramic-watches.

European Search Report and Written Opinion for Application No. 20157480.3, dated Oct. 21, 2020.

Guo, H. et al., Cold sintering process for 8 mol%Y2O3-stabilized ZrO2 ceramics, Journal of the European Ceramic Society, 37(5), 2303-2308, 2017.

Hutchinson, J.W. et al., "Mechanisms of toughening in ceramics", Theoretical and Applied Mechanics, 139-144, 1989.

He, G. et al., "Research Progress on Polymer-based Dielectric Composites", Materials Review, 23, 2011, pp. 85-91.

International Search Report and Written Opinion in Corresponding PCT Application No. PCT/IB2020/059515, mailed Jan. 20, 2021.

Liu, J. et al., "Learn Iron and Forestry Engineering", *Engineering Materials, University of Technology Press*, pp. 280-282, Nov. 2016.

Luo, Y. et al., "PTC Characteristics and Microstructures of a Polymer Based Conductive Composite Filled with Various Titanium Compounds" China Plastics, 5, 2004.

Parhizkar, M. et al. "Correlation between sintering pressure and electrical properties of hot-press sintered gallium arsenide-polyaniline-polyethylene composite varistors", Materials Science in Semiconductor Processing, 17 pp. 143-148, 2014.

Peng, H. et al., The dimensional effect of MgTiO3 ceramic filler on the microwave dielectric properties of PTFE/MgTiO3 composite with ultra-low dielectric loss. J Mater Sci: Mater Electron 30, 6680-6687 (2019). https://doi.org/10.1007/s10854-019-00977-y.

Stinson, L., "Here's What You Need to Know About Ceramic, The Fancy Material in Apple's Fanciest Watch", WIRED, Sep. 8, 2016. https://www.wired.com/2016/09/apples-new-high-end-watch-crazy-tough-ceramics-baby/.

Stunda-Zujeva, A. et al. "Controlling the morphology of ceramic and composite powders obtained via spray drying—A review", Ceramics International, 43 pp. 11543-11551, 2017.

Tai, J. et al., "Synthesis of Ceramic Precursor Polyvinylsilazane-b-Polystyrene and Preparation of Ceramic Nanoparticles", Journal of Synthetic Crystals, 5, 2011. pp. 1266-1270.

Wolff, M. et al. "Novel, highly-filled ceramic-polymer composites synthesized by a spouted bed spray granulation process", Composites Science and Technology, 90, pp. 154-159, 2014.

* cited by examiner

POLYMER-CERAMIC COMPOSITE HOUSINGS AND HOUSING COMPONENTS FOR PORTABLE ELECTRONIC DEVICES

CROSS-REFERENCE TO RELATED APPLICATIONS

This application is a national phase application under 35 U.S.C. § 371 of International Application No. PCT/IB2020/059515 filed Oct. 9, 2020, which claims the benefit of priority of European Patent Application No. 20157480.3 filed Feb. 14, 2020, and U.S. Provisional Patent Application No. 62/914,278 filed Oct. 11, 2019, all of which are hereby incorporated by reference in their entirety.

FIELD OF INVENTION

The present disclosure relates generally to polymer-ceramic composite housings for portable electronic devices, and, more particularly but not by way of limitation, to portable electronic device housings and housing components with high proportions of ceramic and methods of making such housings and housing components.

BACKGROUND

Portable electronic devices often have one or more emitters and/or receivers for transmitting and receiving radio frequency (RF) signals, respectively. Full metal housings may block such RF signals, limiting their use for portable electronic devices. To allow radio signals to pass through the metal housings, complex molding technologies typically are needed to incorporate plastic antenna splits in the housing, which leads to undesired esthetical differences in the housing and increased costs. Ceramic materials generally are RF transparent (e.g., permit transmission and/or receipt of RF signals such as Wi-Fi, Bluetooth, GPS, wireless telecommunications signals, and the like), and are usually strong and scratch-resistant. However, ceramic materials tend to be susceptible to cracking, rendering construction of an all-ceramic housing difficult. Polymers are RF transparent, crack-resistant, and impact-resistant, but are susceptible to scratching and lack stiffness. There accordingly are challenges associated with the construction and use of ceramic and polymeric housings.

There are currently a limited number of ceramic-polymer composites with a high proportion of ceramic. Known ceramic-polymer composites typically contain significantly less than 50% by volume of ceramic, and significantly more than 50% by volume of polymer.

A first category of such ceramic-polymer composites relies on a thermoset approach in which a monomer is combined with the porous ceramic structure and cured to form a composite. But this approach generally requires undesirably-long curing times, and density of a final part is generally dependent on the size of pores in the ceramic and the viscosity of the resin.

A second category of such ceramic-polymer composites relies on thermoplastic polymers, which generally do not require time to cure and can instead be simply heated to melt and subsequently cooled to solidity the thermoplastic polymer, thereby enabling relatively faster processing. Ceramic fillers have been compounded with thermoplastics to achieve certain properties, including stiffness and strength. However, the ceramic filler content in such thermoplastic polymers is typically limited to significantly less than 50% by volume due to limitations of conventional compounding technology. For example, in a traditional approach of this type, a ceramic filler is added to a polymer and the mixture is compounded in an extruder and palletized. Generally, the dispersion and distribution of the ceramic filler in the polymer matrix is highly dependent on the type of ceramic and polymer, other additives and coupling agents, rate of mixing, shear rate, temperature, and various other parameters. Due at least to these limitations, higher proportions of ceramics fillers e.g., greater than 50% by volume) in a polymer matrix is challenging, and may for example damage the screws in an extruder (depending on the hardness of the ceramic) and degrade the polymer because of shear and heat.

A third category of such ceramic-polymer composites relies on the more-recently identified approach known as "cold sintering," various aspects of which may be described in U.S. Patent App. Pub. No. US 2017/0088471 and PCT Application Pub. Nos. (1) WO 2018/039620, (2) No. WO 2018/039628, (3) WO 2018/039619, and (4) WO 2018/039634. One drawback with cold sintering, however, is that not all ceramics can be effectively cold sintered. For example, certain structural ceramics like Aluminum Oxide, Zirconia, Titanium Oxide, and Silicon Carbide generally cannot be cold sintered. Additionally, the structures produced by cold sintering typically utilize ceramic as the matrix and polymer as the filler, which generally results in differing structural properties and differing suitability for various end-use applications.

A fourth category of such ceramic-polymer composites can involve dissolving an amorphous polymer in a solvent, and mixing ceramic particles into the polymer-solvent mixture. For example, a sprouted-bed granulation process can be used to create polymer-coated ceramic powders, such as described in Wolff, Composites Science and Technology 90 (2014) 154-159.

SUMMARY

The present housings and methods address the need for an improved portable electronic device housing through the use of polymer-ceramic composites. The present methods can include heating and pressing a polymer-ceramic core-shell particles, or injection molding such core-shell particles. Such housing components can be used to manufacture a portable electronic device housing. The properties of the present housings can be tailored by selecting an appropriate proportion of ceramic and polymer to attain adequate scratch-resistance, strength, toughness, RF transparency, and the like for a portable electronic device.

This disclosure includes housings and housing components for portable electronic devices, which housings and housing components are molded from core-shell particles. Such core-shell particles comprise a core and a shell around the core, in which the shell comprises a polymer, and the core comprises a ceramic. The polymer is either amorphous or semi-crystalline, and is selected from the group of polymers consisting of: polyphenylene ether (PPE), polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), polyethylene (PE), semi-crystalline polyimide (SC PI), and semi-crystalline polyamide (SC Polyamide). In some configurations, the polymer may be selected from a group consisting of any subset of the group in the preceding sentence (e.g., the group may omit PPE and/or one or more of the other polymers). In some configurations, the polymer may be selected from a group consisting of any subset of the group in the preceding sentence (e.g., the group may omit PPE and/or one or more of the other polymers). Certain of these polymers (PPE) are typically amorphous in the core-shell particles formed by the present methods; certain others of these polymers (PPS, PAEK, PBT, PP, PE, SC PI, and SC Polyamide) are typically semi-crystalline in the core-shell particles formed by the present methods; and certain others of these polymers (PC copolymers, PEI, PEI copolymers, PPSU, PAES, and PES are typically amorphous before being subjected to the present methods but typically exhibit induced crystallinity in the core-shell particles formed by the present methods.

The ceramic is selected from the group of ceramics consisting of: Alumina ($Al_2O_3$), Ferric Oxide ($Fe_2O_3$), Iron (II, III) Oxide ($Fe_3O_4$), Zinc Oxide (ZnO), Zirconia ($ZrO_2$), and Silica ($SiO_2$). Such core-shell particles, and powders and pellets thereof, permit the molding of ceramic-composite molded parts with high ceramic content by conventional processes such as compression molding and injection molding.

The described process of making polymer-ceramic core-shell particles permit the formation of such core-shell particles with relatively uniform coatings of the polymer shell material. More particularly, in such core-shell particles (formed by the described process), the shell can surround substantially all of the surface of the core, at least in configurations in which the polymer comprises at least 10% by volume of the core-shell particles. Likewise, such core-shell particles (formed by the described process) facilitate the molding of ceramic-polymer composite parts with significantly less agglomeration of ceramic particles than prior compounding methods in which parts are molded from a mixture of separate ceramic particles and polymer particles than prior methods. By way of example, and not to be limited by a particular theory, it is currently believed that the substantially uniform polymer coating formed on the ceramic core causes the polymer to resist separation from the ceramic during processing and molding, and thereby resist contact between (and agglomeration of) the ceramic cores. Further, the described process of making polymer-ceramic core-shell particles permit the formation of relatively fine, relatively consistent powders without the need for grinding or sieving. The described process can also result in core-shell particles with less variation in size relative to the starting polymer powder which, in turn, leads to more uniform distribution of ceramic and polymer in molded part than has been possible with traditional compounding methods in which parts are molded from a mixture of separate ceramic particles and polymer particles. For example, as described in more detail below in Table 1B, the Dv90 of the PPS-$Al_2O_3$ was about 32% of the Dv90 of the raw PPS powder used in the described examples.

Ultimately, the described process permits the formation of powders of polymer-ceramic core-shell particles with relatively large fractions of ceramic (e.g., greater than 50% by volume, between 50% and 90% by volume, between 50% and 70% by volume, and/or the like). By way of further example, for ceramic:polymer ratios between 55:45 and 65:45 by volume, the ceramic particles can have a surface area of from 2 to 4 $m^2/g$ (e.g., from 2 to 2.5 $m^2/g$, 2 to 3 $m^2/g$, 2 to 3.5 $m^2/g$, 2.5 to 3 $m^2/g$, 2.5 to 3.5 $m^2/g$, 2.5 to 4 $m^2/g$, 3 to 3.5 $m^2/g$, 3 to 4 $m^2/g$, or 3.5 to 4 $m^2/g$); for ceramic:polymer ratios between 50:50 and 60:40 by volume, the ceramic particles can have a surface area of from 3 to 6 $m^2/g$ (e.g., from 3 to 3.5 $m^2/g$, 3 to 4 $m^2/g$, 3 to 4.5 $m^2/g$, 3 to 4 $m^2/g$, 3 to 5 $m^2/g$, 3 to 4 $m^2/g$, 3 to 5.5 $m^2/g$, 3.5 to 4 $m^2/g$, 3.5 to 4.5 $m^2/g$, 3.5 to 5 $m^2/g$, 3.5 to 5.5 $m^2/g$, 4 to 4.5 $m^2/g$, 4 to 5 $m^2/g$, 4 to 5.5 $m^2/g$, 4.5 to 5 $m^2/g$, 4.5 to 5.5 $m^2/g$, or 5 to 5.5 $m^2/g$); for ceramic:polymer ratios between 60:40 and 70:30 by volume, the ceramic particles can have a surface area of from 1 to 3 $m^2/g$ (e.g., from 1 to 1.5 $m^2/g$, 1 to 2 $m^2/g$, 1 to 2.5 $m^2/g$, 1.5 to 2 $m^2/g$, 1.5 to 2.5 $m^2/g$, 1.5 to 3 $m^2/g$, 2 to 2.5 $m^2/g$, 2 to 3 $m^2/g$, or 2.5 to 3 $m^2/g$); and for ceramic:polymer ratios between 70:30 and 90:10 by volume, the ceramic particles can have a surface area of from 0.5 to 2 $m^2/g$ (e.g., from 0.5 to 1 $m^2/g$, 0.5 to 1.5 $m^2/g$, 0.5 to 2 $m^2/g$, 1 to 1.5 $m^2/g$, 1 to 2 $m^2/g$, or 1.5 to 2 $m^2/g$).

By way of example, such polymer-ceramic core-shell particles with higher proportions of structural ceramic (i.e., $Al_2O_3$, ZnO, $Fe_2O_3$, $Fe_3O_4$, $ZrO_2$, or $SiO_2$) can be beneficial in structural components like gears, CE housings, protective shields, and the like because these types of applications typically benefit from properties such as wear resistance, hardness, scratch resistance, toughness, and stiffness. Additionally, the inclusion of ceramic particles in a polymer matrix can permit the adjustment and/or selection of properties like dielectric constant, dissipation factor, and RF transparency that can be beneficial for certain electronics applications.

In certain configurations of the present housing parts for a portable electronic device, the housing part comprises: a housing component comprising ceramic particles in a polymer matrix, the ceramic particles comprising from 50% to 90% by volume of the housing component, and the polymer matrix comprising from 10% to 50% by volume of the housing component; where the ceramic particles comprise one or more ceramics selected from the group of ceramics consisting of: $Al_2O_3$, $Fe_3O_4$, $Fe_2O_3$, ZnO, $ZrO_2$, $SiO_2$, and combinations of any two or more of these ceramics; where the polymer matrix comprises a first polymer selected from the group of polymers consisting of: polyphenylene ether (PPE), polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), polyethylene (PE), semi-crystalline polyimide (SC PI), and semi-crystalline polyamide (SC Polyamide); where the ceramic particles have a Dv50 of from 50 nanometers to 100 micrometers; where the ceramic particles are substantially free of agglomeration; and where the housing component has a relative density greater than 90%; and where the housing component is configured to cover a portion of a portable electronic device. In some configurations, the polymer may be selected from a group consisting of any subset of the group in the preceding sentence (e.g., the group may omit PPE and/or one or more of the other polymers). In some configurations, the polymer may be selected from a group consisting of any subset of the group in the preceding sentence (e.g., the group may omit PPE and/or one or more of the other polymers).

In certain implementations of the present methods of molding a housing part for a portable electronic device, the method comprises: disposing ceramic particles and polymer in a working portion of a cavity in a mold by: disposing a powder or pellets of polymer-ceramic core-shell particles in the working portion; and/or heating a powder or pellets of polymer-ceramic core-shell particles to a temperature that exceeds a melting temperature (Tm) of the polymer if the polymer is semi-crystalline, or exceeds a glass transition temperature (Tg) of the first polymer if the first polymer is amorphous, and disposing the heated ceramic particles and polymer in the working portion; where each of the core-shell particles comprises a ceramic core and a polymer shell around the core; where the core comprises a particle of a ceramic selected from the group of ceramics consisting of: $Al_2O_3$, $Fe_3O_4$, $Fe_2O_3$, ZnO, $ZrO_2$, $SiO_2$, and combinations of any two or more of these ceramics; where the shell comprises a first polymer selected from the group of polymers consisting of: polyphenylene ether (PPE), polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), polyethylene (PE), semi-crystalline polyimide (SC PI), and semi-crystalline polyamide (SC Polyamide); where the ceramic cores comprise from 50% to 90% by volume of the powder or pellets, and where the polymer shells comprise from 10% to 50% by volume of the powder or pellets. In some implementations, the polymer may be selected from a group consisting of any subset of the group in the preceding sentence (e.g., the group may omit PPE and/or one or more of the other polymers). In some configurations, the polymer may be selected from a group consisting of any subset of the group in the preceding sentence (e.g., the group may omit PPE and/or one or more of the other polymers). In some implementations, the method further comprises heating the mold to a first temperature that: exceeds the Tm of the first polymer if the first polymer is semi-crystalline, or exceeds the Tg of the first polymer if the first polymer is amorphous; subjecting the powder in the mold to a first pressure while maintaining the temperature of the mold to or above the first temperature to define a housing component in which the ceramic particles are substantially free of agglomeration; cooling the housing component to a temperature below the Tg or Tm of the first polymer; and removing the housing component from the mold.

The housing part can defines at least a portion of a watch bezel, phone cover, laptop computer housing, or tablet cover.

The terms “a” and “an” are defined as one or more unless this disclosure explicitly requires otherwise. The terms “substantially” and “about” are each defined as largely but not necessarily wholly what is specified (and includes what is specified; e.g., substantially 90 degrees includes 90 degrees), as understood by a person of ordinary skill in the art. In any disclosed embodiment, the term “substantially” or “about” may be substituted with “within [a percentage] of” what is specified, where the percentage includes 0.1, 1, 5, and 10 percent.

The phrase “and/or” means and or. To illustrate, A, B, and/or C includes: A alone, B alone, C alone, a combination of A and B, a combination of A and C, a combination of B and C, or a combination of A, B, and C. In other words, “and/or” operates as an inclusive or. The phrase “at least one of A and B” has the same meaning as “A, B, or A and B.”

Further, a device or system that is configured in a certain way is configured in at least that way, but it can also be configured in other ways than those specifically described.

The terms “comprise” (and any form of comprise, such as “comprises” and “comprising”), “have” (and any form of have, such as “has” and “having”), and “include” (and any form of include, such as “includes” and “including”) are open-ended linking verbs. As a result, an apparatus that “comprises,” “has,” or “includes” one or more elements possesses those one or more elements, but is not limited to possessing only those one or more elements. Likewise, a method that “comprises,” “has,” or “includes” one or more steps possesses those one or more steps, but is not limited to possessing only those one or more steps.

As used herein, a “size” or “diameter” of a particle refers to its equivalent diameter—referred to herein as its diameter—if the particle is modelled as a sphere. A sphere that models a particle can be, for example, a sphere that would have or produce a value measured for the particle, such as the particle’s mass and/or volume, light scattered by the particle, or the like. Particles of the present dispersions can, but need not, be spherical.

Any embodiment of any of the apparatuses, systems, and methods can consist of or consist essentially of—rather than comprise/have/include—any of the described steps, elements, and/or features. Thus, in any of the claims, the term “consisting of” or “consisting essentially of” can be substituted for any of the open-ended linking verbs recited above, in order to change the scope of a given claim from what it would otherwise be using the open-ended linking verb.

The feature or features of one embodiment may be applied to other embodiments, even though not described or illustrated, unless expressly prohibited by this disclosure or the nature of the embodiments.

Some details associated with the embodiments are described above and others are described below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers.

DETAILED DESCRIPTION OF ILLUSTRATIVE EMBODIMENTS

Figure 1:
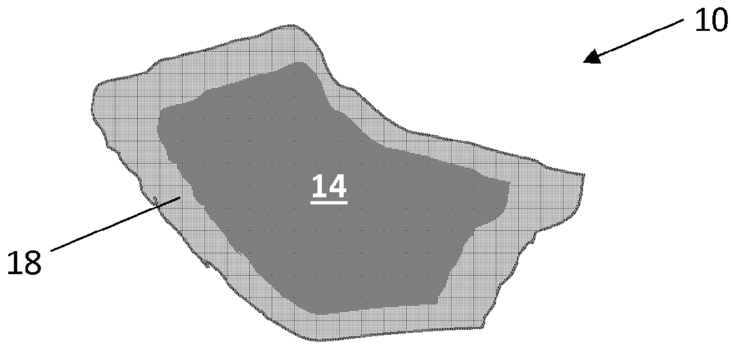
FIG. 1 is a schematic illustration of one of the present core-shell particles comprising a polymer shell and a core of polymer.

Referring now to the drawings, and more particularly to FIG. 1, a schematic illustration is shown of one of the present core-shell particles 10 comprising a core 14 and a shell 18 around the core. In the illustrated configurations, for example, core 14 comprises a single particle of Alumina ($Al_2O_3$), Ferric Oxide ($Fe_2O_3$), Iron (II, III) Oxide ($Fe_3O_4$), Zinc Oxide (ZnO), Zirconia ($ZrO_2$), or Silica ($SiO_2$), and may have a spherical, elongated (e.g., cylindrical), irregular, or otherwise fanciful shape as shown. In other configurations, the core may comprise an agglomeration of two or more particles, and/or may have a substantially spherical shape. Shell 18 comprises a polymer selected from the group of polymers consisting of: polyphenylene ether (PPE), polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), polyethylene (PE), semi-crystalline polyimide (SC PI), and semi-crystalline polyamide (SC Polyamide). In the illustrated configuration, shell 18 covers or surrounds substantially all of core 14. In other configurations, the shell need not cover or surround all of the core (e.g., may cover a majority of the core). As described in more detail below, the present methods permit the formation of a polymer shell (e.g., 18) that is not cross-linked and, for certain polymers, that exhibits induced crystallinity.

In the present core-shell particles, the core (e.g., 14) can have a particle size (e.g., diameter or minimum transverse dimension) of from 100 nanometers (nm) to 100 micrometers (μm). For example, the cores in a ceramic powder used to form core-shell particles in the present methods can have a Dv90 or Dv50 of between 100 nm and 100 μm (e.g., from 100 nm to 500 nm, from 100 nm to 400 nm, from 1 μm to 100 μm, from 1 μm to 50 μm, from 2 μm to 50 μm, from 3 μm to 20 μm, from 2 μm to 10 μm, from 3 μm to 10 μm, from 4 μm to 10 μm).

The present powders comprise a plurality of particles 10, for example in a powder form. For example, a powder may be characterized by a polymer-solvent content (a solvent in which the polymer is dissolvable) of less than 3,000 3,000 parts per million (ppm) (e.g., less than 2,000 ppm, less than 1,000 ppm). However, in some configurations, the powder may mixed with and/or suspended in a liquid that is not a polymer-solvent (a liquid in which the polymer will not dissolve), such as water. In such configurations, the liquid may resist and/or prevent particles from becoming airborne or breathable, such as for transportation and handling of finer powders.

In some configurations of such powders, the core-shell particles comprise between 50% and 90% by volume of the ceramic (e.g., 50% and 70% by volume of the ceramic).

Figure 2:
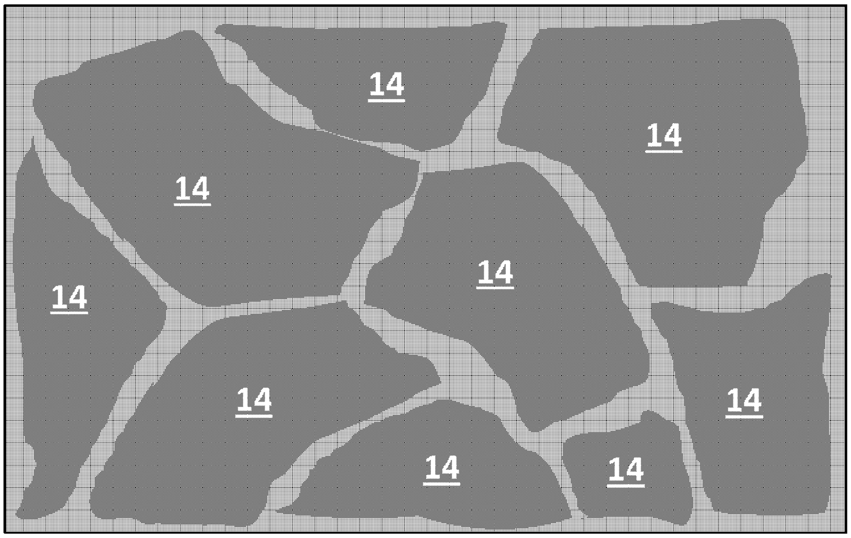
FIG. 2 is a schematic illustration of the internal structure of a part molded from a dry powder of the present core-shell particles.

FIG. 2 is a schematic illustration of the internal structure of a part molded from a dry powder of the present core-shell particles 10. As shown, the polymer shells 18 of adjacent particles merge together to fill interstices between and bond the particles together. As shown, the relatively higher proportion (e.g., 50% to 90% by volume) of ceramic in the powder means that a correspondingly higher proportion of the molded part is also ceramic. Further, the core-shell structure of the particles prior to molding results in more-uniform distribution of polymer within the matrix of the molded part. By way of example, the present core-shell particles, in which the ceramic particles are substantially free of agglomeration and/or substantially all of the ceramic particles are each substantially surrounded by polymer, enable the molding of parts that are also substantially free of agglomeration and/or in which substantially all of the ceramic particles is separated by a layer of polymer from adjacent ceramic polymer particles.

The present powders can also be pelletized or joined into a pellet form in which the shells of adjacent core-shell particles are joined to resist separation of the adjacent core-shell particles and deformation of a respective pellet. For example, the present powders may be subjected to elevated temperatures and pressures in an extruder. Such temperatures may be at or near the glass transition temperature ($T_g$) of the polymer in the core-shell particles to render the polymer tacky but not liquefied, and such pressures (e.g., during extrusion) may be elevated relative to ambient, such that shells of adjacent core-shell particles join sufficiently to resist separation but no so much that the independent boundaries/identities of adjacent shells are lost. In such configurations, the pellet form may facilitate transportation of the core-shell particles (e.g., for distribution). Such pelletization can be achieved by any of various methods and processes that are known in the art, such as, for example, via a screw extruder.

Polyphenylene Ether (PPE) Resins

Generally, polyphenylene ether (PPE) is known in the art as a high-temperature thermoplastic. PPE is typically not used in its pure form due to difficulties in processing, and is instead primarily used as blend with polystyrene, high impact styrene-butadiene copolymer, or polyamide. PPE includes unsubstituted polyphenylene ether polymers, substituted polyphenylene ether polymers wherein the aromatic ring is substituted, polyphenylene ether copolymers and blends thereof. Also included are polyphenylene ether polymers containing moieties prepared by grafting onto the polyphenylene ether in a known manner such materials as vinyl monomers or polymers such a polystyrenes and elastomers, as described in U.S. Pat. No. 5,089,566 issued to S. Bruce Brown. Coupled polyphenylene ether polymers in which coupling agents such as low molecular weight polycarbonates, quinones, heterocycles and formals undergo reaction in the known manner with the hydroxy groups of two phenyl ether chains to produce a high molecular weight polymer are also included.

Various types of PPE resins may be used in the present core-shell particles and in the present methods, and may be prepared by various methods known in the art, examples of which are described in U.S. Pat. No. 7,595,367 to SABIC Global Technologies BV. For example, various PPE resins are available from SABIC Innovative Plastics in designated grades of polyphenylene oxide (PPO), such as, for example, PPO Grade PPO640 having an intrinsic viscosity (IV) of 0.4 grams per cubic centimeter ($g/cm^3$), PPO Grade PPO630 having an IV of 0.33 $g/cm^3$, and PPO Grade PPO646 having an IV of 0.46 $g/cm^3$. The examples described below utilized a poly(2,6-dimethyl-1,4-phenylene ether) having an intrinsic viscosity of about 0.40 deciliter per gram ($g/cm^3$) in chloroform at 25° C., obtained as PPO640 from SABIC Innovative Plastics. PPO grades available from SABIC Innovative Plastics (e.g., PPO640) are bifunctional poly(arylene ether), the structure of which is given by Formula (3):

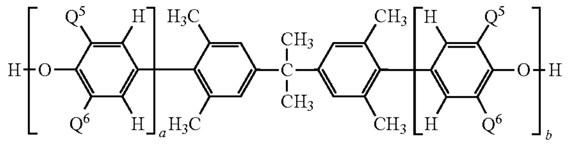

wherein each occurrence of Q5 and Q6 is independently methyl or di-n-butylaminomethyl; and each occurrence of a and b is independently 0 to about 20, provided that the sum of a and b is at least 2 (e.g., 2, 3, 4, or more). Bifunctional poly(arylene ether) s having this structure can be synthesized by oxidative copolymerization of 2,6-xylenol and 2,2-bis(3,5-dimethyl-4-hydroxyphenyl) propane in the presence of a catalyst comprising di-n-butylamine.

Polyphenylene Sulfide (PPS) Resins

Generally, polyphenylene sulfide (PPS) is known in the art as a high-performance thermoplastic. PPS can be molded, extruded, or machined to tight tolerances, and has a relatively high maximum service temperatures of about 218° C. The poly(arylene sulfide) may be a homopolymer or a copolymer. For instance, selective combination of dihaloaromatic compounds can result in a poly(arylene sulfide) copolymer containing not less than two different units. The poly(arylene sulfide) may be linear, branched or a combination of linear and branched, and may be functionalized or unfunctionalized. Regardless of the particular structure, the weight average molecular weight of the poly(arylene sulfide) can be greater than or equal to 10,000 grams per mole (g/mol) (e.g., greater than 15,000 g/mol, greater than 20,000 g/mol, or more).

Various grades of PPS are commercially available and may be used in the present core-shell particles and methods; for example, linear poly(arylene sulfide) is commercially available from Celanese Corporation as Fortron® PPS and from Solvay as Ryton® PPS. The PPS used in the below-described examples was a grade FORTRON* 0214 course PPS powder available from Celanese Corporation (*Trademark of Celanese Corporation). Generally, the present methods and core-shell particles utilize PPS with a molecular weight (Mw) in excess of 10,000.

Polyaryl Ether Ketone (PAEK)

PAEK is a semi-crystalline thermoplastic that is recognized in the art as having excellent mechanical and chemical resistance properties that are retained to high temperatures. The processing conditions used to mold PEEK can influence the crystallinity and hence the mechanical properties. PEEK is commercially available from Victrex Ltd. as VICTREX PEEK.

Examples of polyaryletherketones (PAEKs) that are usable in at least some of the present configurations/implementations can include polyetheretherketone (PEEK), polyetherketone (PEK), polyetherketoneketone (PEKK), polyetheretherketoneketone (PEEKK), and polyetherketoneetherketoneketone (PEKEKK). Suitable compounds from these groups are known in the art. Particular commercial examples include PEEK™ and PEK™ polymer types (available from Victrex plc.), especially PEEK™ 450P, PEEK™ 150P and PEK™ P22. In particular, the PEEK used in the below-described examples was a grade PEEK 150G.

Polybutylene Terephthalate (PBT)

Polybutylene Terephthalate (PBT) is a semi-crystalline engineering thermoplastic material that is used, for example, as an electrical insulator. Various grades of PBT are commercially available, including, for example, VALOX™ Resin and VALOX™ FR Resin available from SABIC Innovative Plastics.

Polypropylene (PP)

Polypropylene (PP) is a thermoplastic polymer used in a wide variety of applications. The type of polypropylene used in the present applications and can be a PP homopolymer, a PP random copolymer, a heterophasic PP copolymer, or a blend of two or more of the foregoing. That said, in view of the final application of the polypropylene, the polypropylene is generally of a type that can be shaped using injection molding, blow molding or compression molding. Consequently the melt flow index will typically be in the range of from 10-250 g/10 min, such as from 10-100 g/10 min or 20-80 g/10 min or 30-60 g/10 min as determined in accordance with ISO 1 133 (2.16 kg, 230° C.).

Polyethylene (PE)

Polyethylene (PE) is widely used in numerous applications. Depending on desired properties, the present semi-crystalline polymer-ceramic core-shell particles can comprise low-density PE (LDPE) and/or high-density PE (HDPE), as are known in the art. For example, examples of suitable PE may have a density of from 0.91-0.965 $g/cm^3$ and a melt flow index of from 0.01-12 g/10 min; examples of suitable HDPE may have a density of from 0.94-0.965 $g/cm^3$, and a melt flow index of from 0.01-1 g/10 min; examples of suitable LDPE may have a density of from 0.91-0.93 $g/cm^3$ and a melt flow index of from 0.5-12 g/10 min.

Semi-Crystalline Polyimide (SC PI)

Polyimide (PI) is a polymer of imide monomers. Some types of PI are semi-crystalline. The present disclosure can utilize semi-crystalline PI (SC PI). SC PI may, for example, be based on dianhydrides (aliphatic or aromatic) and diamines (aliphatic or aromatic). Certain examples of SC CPI are known in the art as LARC-CPI. SC PI is available commercially from Mitsui Chemicals in grades of AURUM* (*Trademark of Mitsui), some of which may require annealing to exhibit crystallinity, and from RTP Company as RTP-42xx grades (e.g., RTP 4201).

Semi-Crystalline Polyamide (SC Polyamide)

Polyamide is commonly known in the art as Nylons, some of which are semi-crystalline. The present disclosure can utilize semi-crystalline polyamide. SC polyamide or nylon is available commercially, for example from RTP Company, in various grades, including PA6 or 6 (PA), PA66 or 6/6 (PA), PA11 or 11 (PA), PA12 or 12 (PA), PA610 or 6/10 (PA), PA46 or 4/6 (PA).

Polycarbonate (PC) Copolymers

Polycarbonate (PC) refers generally to a group of thermoplastic polymers containing carbonate groups. PCs used in engineering are strong, tough materials, and some grades are optically transparent. PCs are typically easily worked, molded, and thermoformed, and therefore are used in various applications. The present configurations and implementations utilize a polycarbonate copolymer or interpolymer rather than a homopolymer. Polycarbonate copolymers can include copolycarbonates comprising two or more different types of carbonate units, for example units derived from BPA and PPPBP (commercially available under the trade name XHT or CXT from SABIC); BPA and DMBPC (commercially available under the trade name DMX from SABIC); or BPA and isophorone bisphenol (commercially available under the trade name APEC from Bayer). The polycarbonate copolymers can further comprise non-carbonate repeating units, for example repeating ester units (polyester-carbonates), such as those comprising resorcinol isophthalate and terephthalate units and bisphenol A carbonate units, such as those commercially available under the trade name LEXAN SLX from SABIC; bisphenol A carbonate units and isophthalate-terephthalate-bisphenol A ester units, also commonly referred to as poly(carbonate-ester)s (PCE) or poly(phthalate-carbonate)s (PPC), depending on the relative ratio of carbonate units and ester units; or bisphenol A carbonate units and $C_{6-12}$ dicarboxy ester units such as sebacic ester units (commercially available under the trade name HFD from SABIC). Other polycarbonate copolymers can comprise repeating siloxane units (polycarbonate-siloxanes), for example those comprising bisphenol A carbonate units and siloxane units (e.g., blocks containing 5 to 200 dimethylsiloxane units), such as those commercially available under the trade name EXL from SABIC; or both ester units and siloxane units (polycarbonate-ester-siloxanes), for example those comprising bisphenol A carbonate units, isophthalate-terephthalate-bisphenol A ester units, and siloxane units (e.g., blocks containing 5 to 200 dimethylsiloxane units), such as those commercially available under the trade name FST from SABIC. Combinations of any of the above materials can be used.

Polyetherimide (PEI) and Polyetherimide (PEI) Copolymers

Polyetherimide (PEI) is an amorphous, amber-to-transparent thermoplastic with characteristics similar in some respects to polyether ether ketone (PEEK). Relative to PEEK, PEI may be lower in impact strength and usable temperature. Examples of PEI are available from SABIC Innovative Plastics under the trade names ULTEM, SILEM, and EXTEM.

The polyetherimide can be selected from polyetherimide homopolymers, e.g., polyetherimides, polyetherimide copolymers, e.g., polyetherimide sulfones, and combinations thereof. Polyetherimides include, but are not limited to, known polymers, such as those sold by SABIC Innovative Plastics under the Ultem*, Extem*, and Siltem* brands (Trademark of SABIC Innovative Plastics IP B.V.).

Polyarylethersulfone (PAES)

Polyarylethersulfones or poly(aryl ether sulfone)s (PAES) are typically linear, amorphous, injection moldable polymers possessing a number of desirable features such as excellent high temperature resistance, good electrical properties, and toughness. Due to their excellent properties, the poly(aryl ether sulfone)s can be used to manufacture a variety of useful articles such as molded articles, films, sheets, and fibers.

Polyphenylsulfone (PPSU)

Polyphenylsulfone (PPSU) is an amorphous, heat-resistant and transparent high-performance thermoplastic. PPSU is generally known in the art as having high toughness and flexural and tensile strength, excellent hydrolytic stability, and resistance to chemicals and heat.

The below-described PPSU examples utilized amorphous polyphenylsulfone, CAS Reg. No. 25608-64-4, having a weight average molecular weight of 50,100 grams/mole and a number average molecular weight of 18,500 grams/mole (determined by gel permeation chromatography using a polystyrene standard); having a hydroxyl group content less than 10 parts per million by weight; and obtained in pellet form as RADEL* R5100-5 polyphenylsulfone. RADEL is a trademark of Solvay, Inc.

Polyether Sulfone (PES)

Polyethersulfones (PES) are typically linear, amorphous, injection moldable polymers possessing a number of desirable features such as excellent high temperature resistance, good electrical properties and toughness. Due to their excellent properties, the polyethersulfones can be used to manufacture a variety of useful articles such as molded articles, films, sheets and fibers. PES offers high chemical and solvent resistance and is particularly useful for manufacturing articles that are exposed to solvents or chemical agents at elevated temperatures and for extended times. Thus, PES finds application in articles such as medical trays, which are subjected to repeated and rigorous sterilization procedures.

Methods of Making Powders of Polymer-Ceramic Core-Shell Particles

Figure 3:
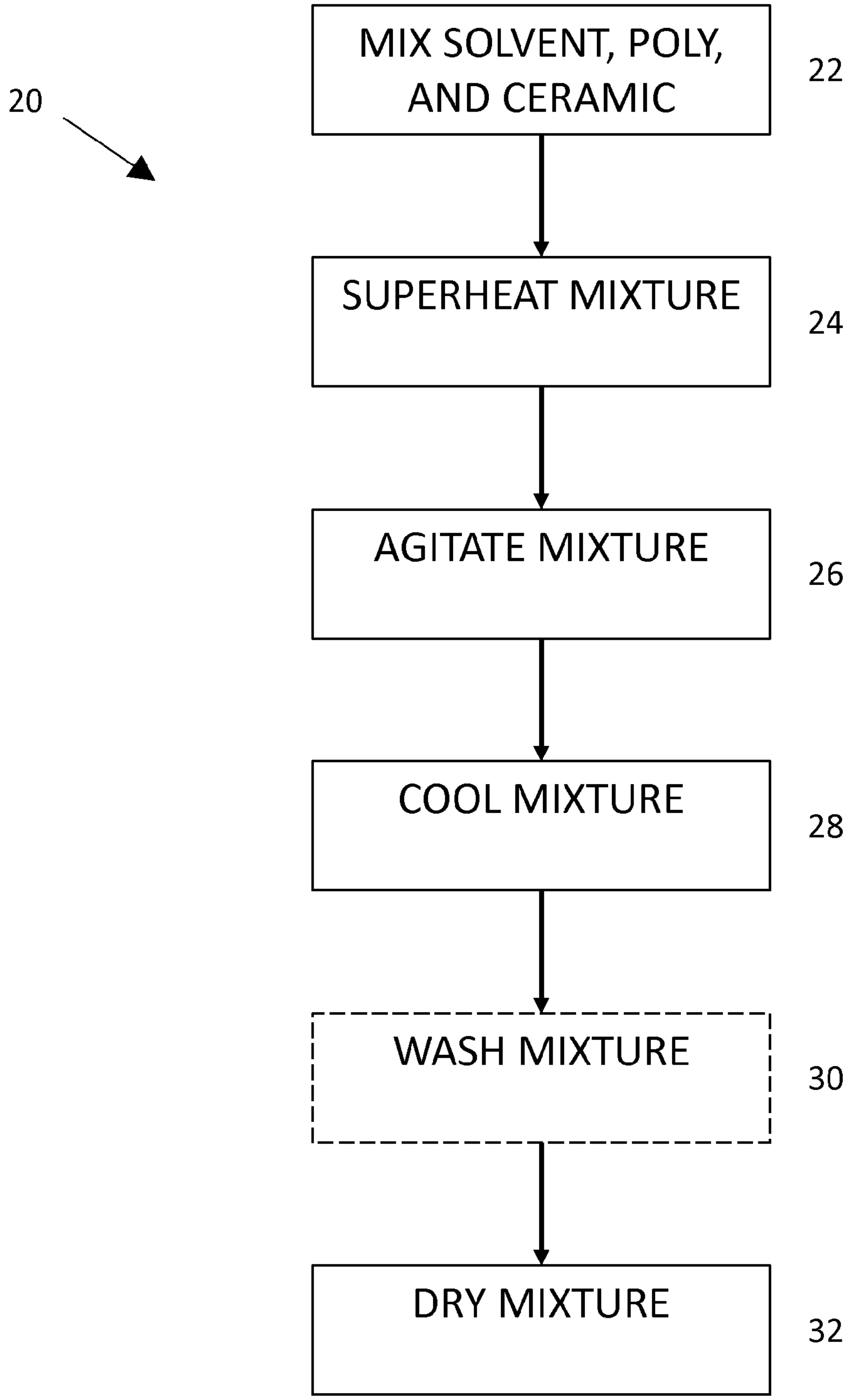
FIG. 3 is a flowchart of one example of a method of making a powder of the present core-shell particles.
Figure 4:
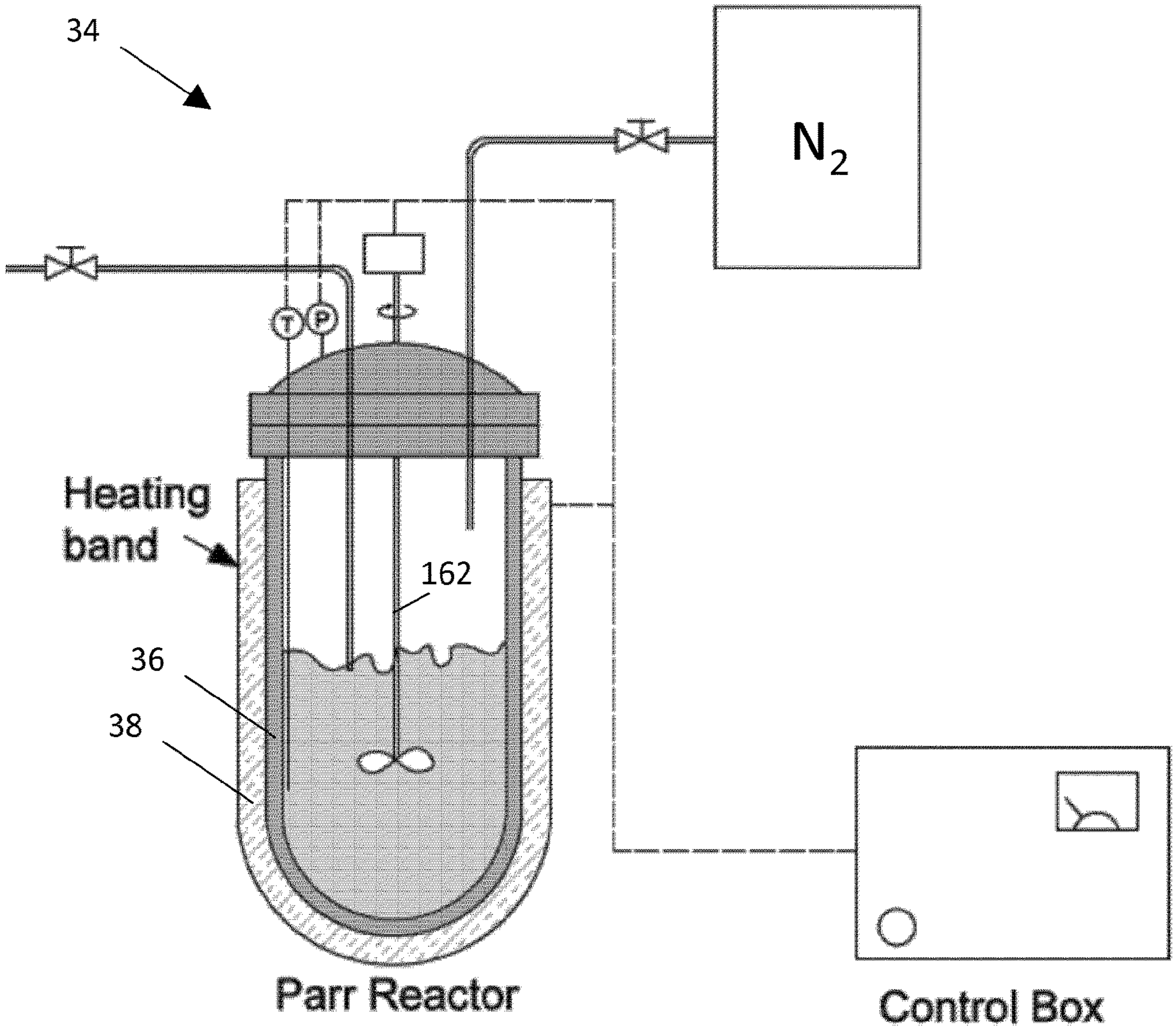
FIG. 4 is a schematic illustration of stirring reactor of a type that can be used to make a powder of the present core-shell particles.

Referring now to FIGS. 3 and 4, FIG. 3 depicts a flowchart 20 of one example of a method of making a powder of the present core-shell particles (e.g. 10), and FIG. 4 depicts a schematic illustration of stirring reactor 34 of a type (e.g., a PARR™ reactor) that can be used to make a powder of the present core-shell particles.

First mixing the ceramic particles with the solvent can have certain benefits, for example, in reducing the agglomerating of ceramic particles. This benefit can be realized whether beginning with ceramic particles that are not agglomerated in their powder form, or with ceramic particles that are agglomerated in their powder form. For example, the $Al_2O_3$ powder (CAS 1344-28-1) used in the below-described examples was obtained from Alfa Aesar and, in its raw form prior to usage in the present methods, comprised spherical hollow particles with an average particle size of from 20 to 50 μm and surface area of from 5 to 6 $m^2/g$. Mixing these hollow particles with solvent prior to adding polymer caused the hollow particles to break down into their smaller, solid particles components, which solid particles had an average particle size of 1 μm or smaller, while also resisting re-agglomeration of the solid particles during the subsequent mixing, dissolution, and precipitation of the polymer on the solid ceramic particles.

At a step 22, polymer, solvent, and particles of ceramic are mixed together. The polymer, solvent, and ceramic may be mixed at the same time in a single vessel, or may be mixed sequentially. For example, the ceramic particles may first be mixed into a solvent (e.g., in a first vessel, such as a homogenizer), and the polymer may subsequently be mixed into the solvent-ceramic mixture (e.g., in the first vessel or in a second vessel, such as a shell or container 36 of stirring reactor 34). The solvent may comprise any solvent in which the polymer will dissolve under superheated conditions, as described below. Other solvents that may be utilized in the present methods include those in which PPS is Freely Soluble or Soluble at elevated temperatures (e.g., above 75° C., above 100° C., about 150° C., and/or above 200° C.), and Slightly Soluble or Sparingly Soluble at lower temperatures (e.g., below 50° C., such as at ambient temperatures), examples of which include: sulfolane, DMSO (dimethyl sulfoxide), DMF (dimethylformamide), DMAC (Dimethylacetamide), chlorobenzene, NEP (N-ethyl pyrrolidone), Methyl Ethyl Ketone (MEK), N-Methyl-2-pyrrolidone (NMP), orthodichlorobenzene (ODCB), Xylene, certain ketones (e.g., MIBK (methyl isobutyl ketone), acetophenone, cyclopentanone, butanone, and 2-hexanone. By way of example, ODCB may be used with PEI and certain PEI copolymers, and Xylene may be used with certain PC copolymers. Other solvents that may be utilized in the present methods include those in which a selected polymer is Freely Soluble or Soluble at elevated temperatures (e.g., above 75° C., above 100° C., about 150° C., and/or above 200° C.), and Slightly Soluble or Sparingly Soluble at lower temperatures (e.g., below 50° C., such as at ambient temperatures). As used in the preceding sentence, Freely Soluble requires 1 to 10 ml of solvent to dissolve 1 gram (g) of the polymer, Soluble requires 10 to 30 ml of solvent to dissolve 1 gram (g) of the polymer; Slightly Soluble requires 100 to 1000 ml of solvent to dissolve 1 gram (g) of the polymer; Sparingly Soluble requires 1000 to 10000 ml of solvent to dissolve 1 gram (g) of the polymer.

At a step 24, the mixture of polymer, ceramic, and solvent is superheated (e.g., via a heating element 38 of reactor 34) to at least partially (e.g., fully) dissolve the polymer in the solvent. In particular, the mixture is heated to a first temperature that exceeds the normal boiling point of the solvent (and exceeds the glass transition temperature of an amorphous polymer, or the melting temperature of a semi-crystalline polymer), under a first pressure at which the solvent remains liquid. For example, when using ODCB as the solvent, the mixture can be heated to 250° C. under a pressure of up to 180 pounds per square inch (psi) (e.g., 75 psi). By way of additional sample, when using Xylene as the solvent, the mixture can be heated to 200° C. under a pressure of up to 180 pounds per square inch (psi) (e.g., 75 psi). When using other solvents, the pressure may be kept at a different level (e.g., 100 psi).

At a step 26, which may be partially or entirely simultaneous with step 24, the mixture is agitated (e.g., via impeller 162 of reactor 34) for a period of minutes (e.g., equal to or greater than 1 minute, 5 minutes, 10 minutes, 20 minutes, 30 minutes, 40 minutes, 50 minutes, 60 minutes, or more) while the temperature of the mixture is substantially maintained at or above the first temperature, and the pressure to which the mixture is subjected is substantially maintained at or above the first pressure. In particular, the temperature and pressure are maintained during agitation to keep the mixture in a superheated state.

At a step 28, the mixture is cooled to or below a second temperature that is below the normal boiling point of the solvent to cause the polymer to precipitate on the particles of the ceramic and thereby form a plurality of the present core-shell particles (e.g., 10). For example, when using ODCB as the solvent, the mixture may be cooled to less than 120° C., less than 110° C., and/or to 100° C. By way of further example, when using Xylene as the solvent, the mixture may be cooled to less than 70° C., less than 60° C., and/or to 50° C. Optionally, the mixture may continue to be agitated during this cooling step to resist agglomeration of the core-shell particles.

At an optional step 30, the formed core-shell particles may be washed or rinsed, either with the same solvent added in step 22 (e.g., ODCB or Xylene) or with a different solvent (e.g, Methanol or MeOH). For example, the wet solids cake can be removed from the vessel (e.g., shell or container 36 of reactor 34) and placed in a filter for rinsing.

At a step 32, the solids cake is dried to form a dry powder of the core-shell particles (e.g., 10), for example, at a temperature above the normal boiling point of the solvent added in step 22 and/or of the solvent used to wash/rinse the solids cake at optional step 30, optionally at a second pressure below ambient pressure (i.e., under vacuum). For example, when ODCB (normal boiling point of ~180° C.) is added at step 22 and MeOH (normal boiling point of ~65° C.) is used in step 30, the solids cake can be dried under vacuum at a temperature of 200° C. for a period of time (e.g., 4 hours, 6, hours, 8 hours, 10 hours, 12 hours, or more). By way of further example, when Xylene (normal boiling point of ~144° C.) is added at step 22 and MeOH (normal boiling point of ~65° C.) is used in step 30, the solids cake can be dried under vacuum at a temperature of 150° C. for a period of time (e.g., 4 hours, 6, hours, 8 hours, 10 hours, 12 hours, or more).

Methods of Molding Parts from Polymer-Ceramic Core-Shell Particle Powders

Figure 5:
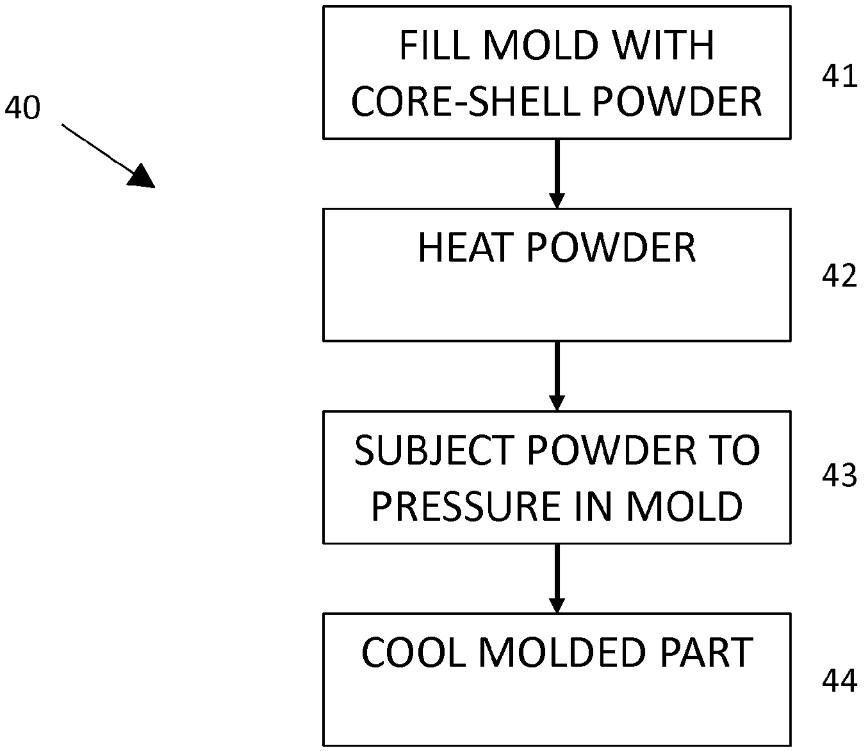
FIG. 5 is a flowchart of one example of a method of molding a part from a powder of the present core-shell particles.
Figure 6:
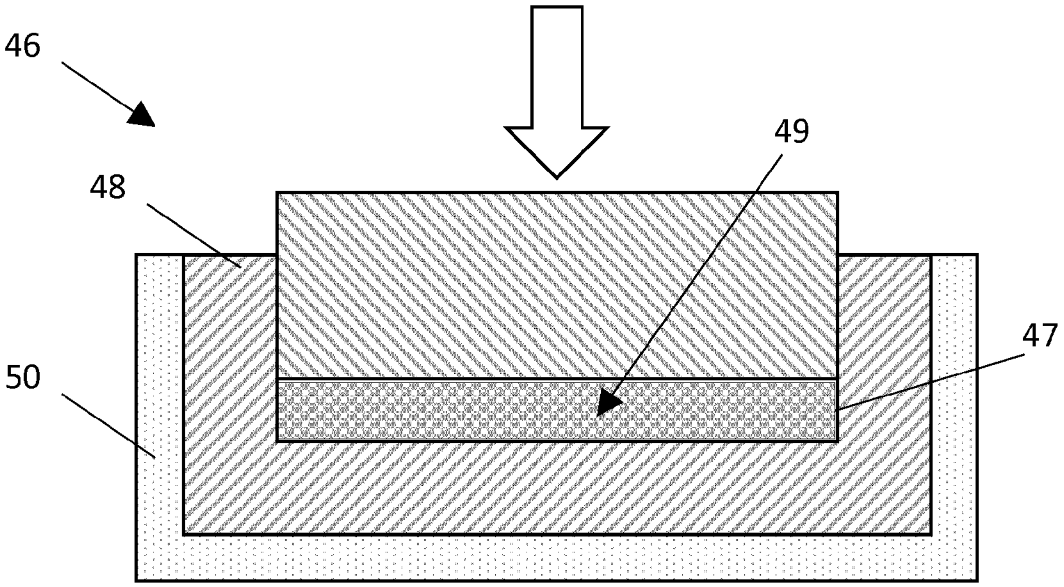
FIG. 6 is a schematic illustration of a compression mold for molding a part.

Referring now to FIGS. 5 and 6, FIG. 5 depicts a flowchart 40 of one example of a method of molding a part from a powder of the present core-shell particles, and FIG. 6 depicts a schematic illustration 250 of a compression mold for molding a part.

At a step 41, a working portion of a cavity 47 of a mold 48 is filled with a powder 49 of the present core-shell particles (e.g., 10).

At a step 42, the powder (49) is heated to at or above a first temperature (e.g., via a heating jacket 50) that exceeds (e.g., by at least 10° C., at least 20° C., at least 30° C., or more) a glass transition temperature ($T_g$) or melting temperature ($T_m$) of the polymer. For example, when the $T_g$ of a particular PEI copolymer is ~225° C., the first temperature can be 250° C. By way of further example, when the $T_g$ of a particular PC copolymer is ~147° C., the first temperature can be 200° C.

At a step 43, which may be partially or entirely simultaneous with step 42, the powder is subjected to a first pressure (e.g., 375 Megapascals (MPa)) in the mold while the powder (e.g., and the mold) is held at or above the first temperature. The pressure may be maintained for a period of minutes (e.g., equal to or greater than 5 minutes, 10 minutes, 20 minutes, 30 minutes, 40 minutes, 50 minutes, 60 minutes, or more). In some implementations, the conditions (temperature, pressure, and/the like) and period of time for which the conditions are maintained are sufficient to result in a molded part with a relative density of greater than 90%.

Figure 7A:
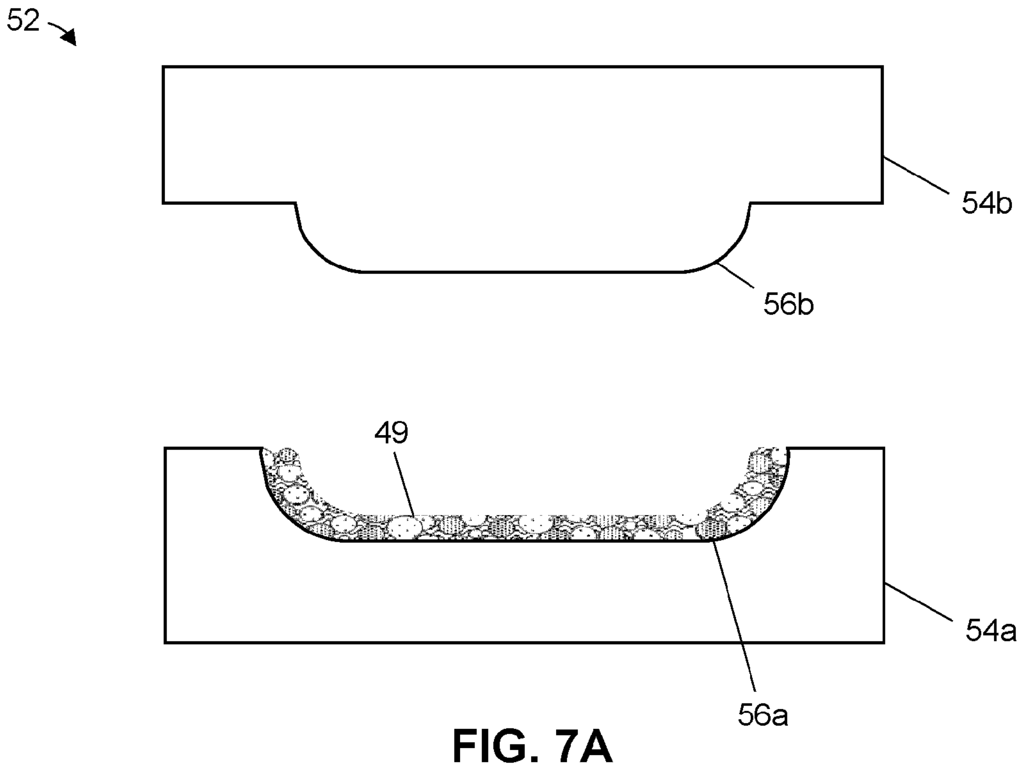
FIGS. 7A-7C are schematic views of a die set that can be used to mold the present core-shell particles and produce a housing component.
Figure 7B:
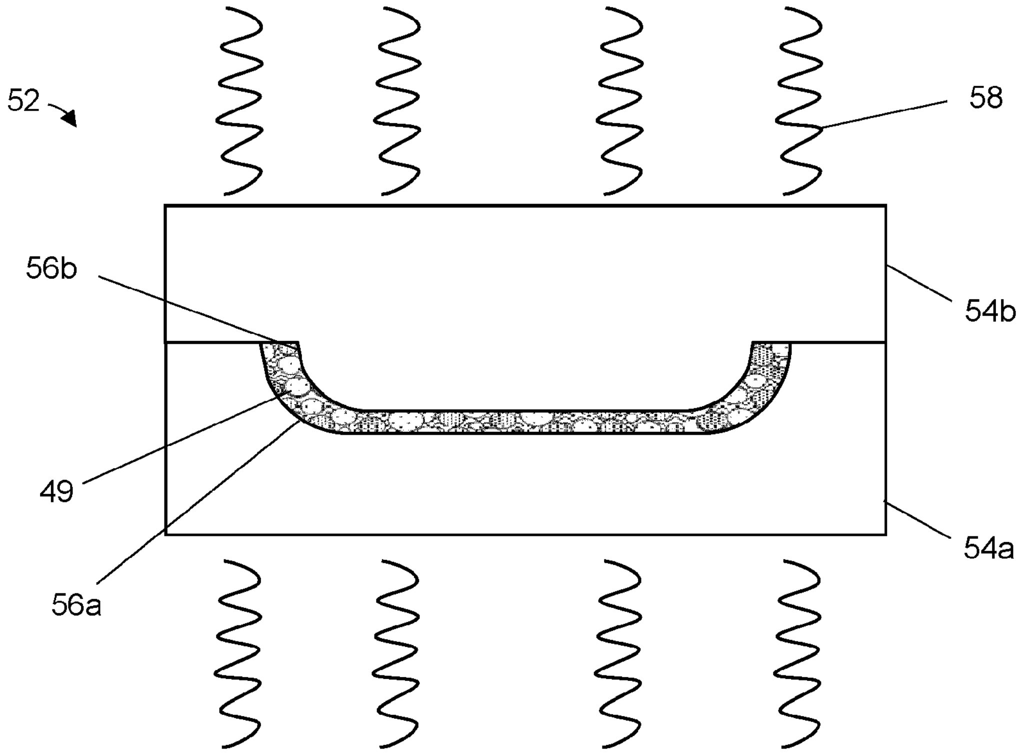
Figure 7C:
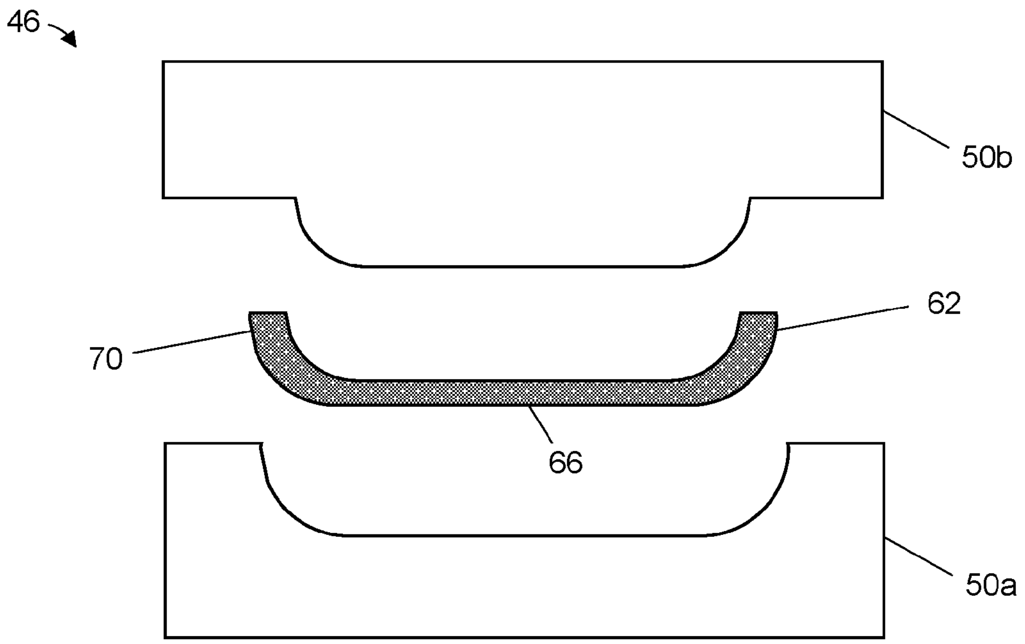

To illustrate, and referring to FIGS. 7A-7C, a system 52 for manufacturing a housing component for a portable electronic device can include first and second dies **54*a* and 54*b*. At least one of first and second dies 54*a* and 54*b* can be movable relative to the other of the dies such that dies are movable between an open state (FIG. 7A) and a closed state (FIG. 7B) in which the dies are configured to cooperate and press the powder 49 of the present core-shell particles (e.g., with pressing surfaces 56*a* and 56*b*). The core-shell particles can be pressed by placing the particles on first die 50*a* and moving first and second dies 50*a* and 50*b*** to the closed state.

Figure 7D:
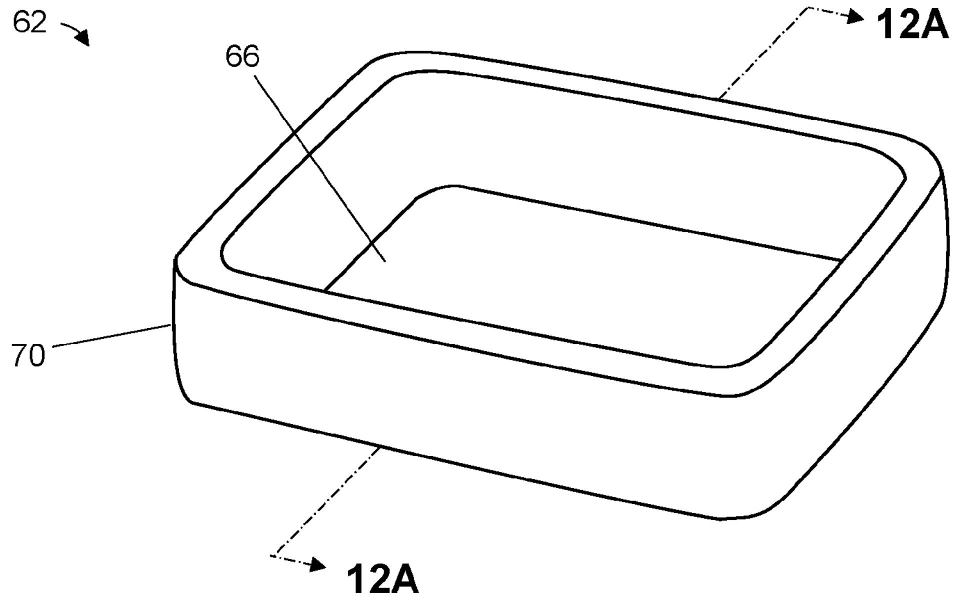
FIG. 7D is a schematic view of a housing component formed according to some of the present methods with a base portion and a lip surrounding at least some of the base portion.

Heating can be performed while the powder is being pressed such that the powder reaches the first temperature above the Tg or Tm of the polymer in the powder (but below the decomposition temperature of the polymer). For example, the first temperature can be less than or equal to, or between any two of 500° C., 480° C., 460° C., 440° C., 420° C., 400° C., 380° C., 360° C., 340° C., 320° C., 300° C., 280° C., 260° C., 240° C., 220° C., 200° C., 180° C., 160° C., 140° C., 120° C., 100° C., or lower (e.g., between 100° C. and 200° C.). Heating can be accomplished with, for example, a heating jacket or a heating mantle. The pressing and heating can densify the core-shell particles to produce a housing component (e.g., 62) that comprises a polymer-ceramic composite (FIGS. 7C and 7D).

As shown, the housing component can be shaped during the molding such that the housing component comprises a base portion (e.g., 66) (which, optionally, can be planar) and a lip (e.g., 70) that extends outwardly from and surrounds at least some of (e.g., the majority or all of) the base portion. Pressing surfaces **56*a* and 56*b* can at least partially define the shape of the housing component. To illustrate, first and second dies 54*a* and 54*b*, when in the closed position, can define a pressing cavity in which pressing surface 56*a* of the first die defines a recess that receives pressing surface 56*b* of the second die. During pressing, the powder can be at least partially disposed within the pressing cavity and between pressing surfaces 56*a* and 56*b*** such that the powder (and thus housing component) conforms about the pressing surfaces.

As discussed above, the present methods are suited to the manufacture of housing components for a portable electronic device, as well as of housings assembled from such housing component(s). For example, manufacturing can be performed at least by assembling the housing component(s) such that the housing is appropriately shaped and sized to accommodate elements of a portable electronic device (e.g., as described below). When a single housing component is used for the housing, the housing may be formed without further assembly after the molding of the core-shell particles. The housing can consist entirely of the housing component(s) (e.g., such that the housing consists of a polymer-ceramic composite); in other embodiments, however, the housing can comprise one or more components that are not produced using the present methods.

Housings manufactured according to the present methods can be used in any suitable portable electronic device, such as a wearable device (e.g., a watch), a phone, a tablet, a computer, and/or the like. Some of the present housings, which can be produced according to some of the present methods, are described in further detail below with reference to electronic devices **90*a*-90*c*. Devices 90*a*-90*c***, however, are not limiting on the present methods or housings, which can be shaped and sized appropriately to accommodate the features of a particular device.

Figure 8A:
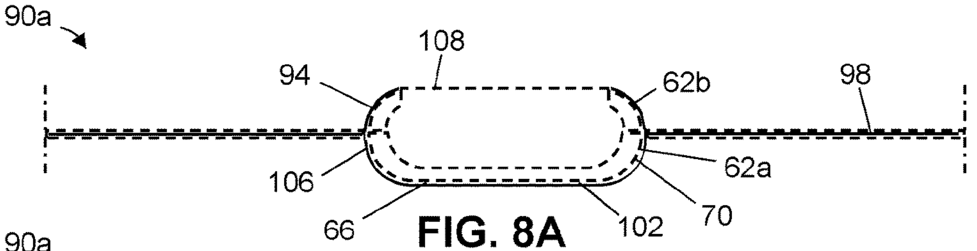
FIGS. 8A and 8B are schematic side and top views, respectively, of a wearable electronic device comprising a polymer-ceramic composite housing.
Figure 8B:
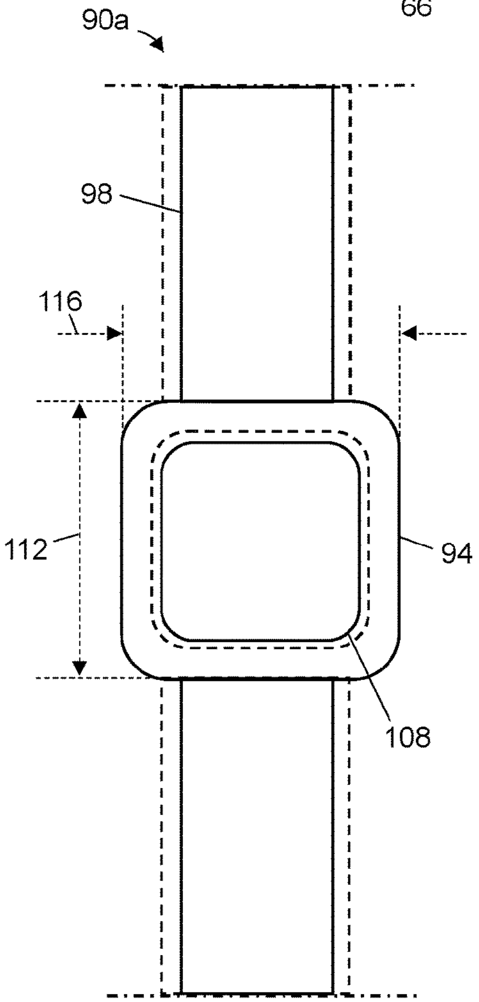

Referring to FIGS. 8A and 8B, shown is a wearable electronic device 90*a* (e.g., a watch) that comprises a housing 94 manufactured according to some of the present methods. Wearable device 90*a* can comprise a strap 98 coupled to housing 94, which can be shaped and sized to facilitate wearability. For example, as shown, housing 94 is a rectangle having a length 112, a width 116 perpendicular to the length, and rounded corners. Length 112 and width 116 are each a distance measured between outer edges of housing 94 along a straight line. Each of length 112 and width 116 can be greater than or equal to, or between any two of, 20, 25, 30, 35, 40, 45, 50, or more millimeters (mm) (e.g., between 30 and 45 mm). However, in other embodiments, a housing can be triangular, rectangular, square, or otherwise polygonal (whether having sharp and/or rounded corners), circular, elliptical, or otherwise rounded, or can have an irregular shape.

Housing 94 can comprise a base portion 102 (which, optionally, can be planar) and a lip 106 that extends outwardly from and surrounds at least some of (e.g., the majority or all of) the base portion. Base portion 102 and lip 106 can thereby define a cavity configured to contain components of the portable electronic device (e.g., signal emitters and receivers, batteries, processors, memory, and/or the like). Housing 94 can define one or more openings (e.g., 108). For example, housing 94 can define an opening 108 where a screen can be coupled to the housing and remain viewable to a user when wearable device 90*a* is worn. Additionally or alternatively, housing 94 can define opening(s) to accommodate, for example, user-input device (s) (e.g., a button, a camera, a microphone, and/or the like) and/or sensor(s) (e.g., a heart-rate sensor, a temperature sensor, and/or the like). When wearable device 90*a* includes sensor(s), housing 94 can define an opening configured to accommodate at least one of the sensor(s) and positioned such that the at least one sensor contacts a wearer during use.

Housing 94, as shown, comprises two of the above-described housing components (e.g., 62*a* and 62*b*); in other embodiments, however, the housing can comprise any suitable number of the housing components, such as, for example, greater than or equal to or between any two of 1, 2, 3, 4, 5, 6, 7, or more housing components (e.g., a single housing component). A first one of the housing component(s) (e.g., 62*a*) can at least partially define base portion 102 and/or lip 106 of housing 94. For example, housing component 62*a* can be shaped during molding (e.g., as described above in reference to FIGS. 7A-7D) such that base portion 66 and lip 70 of housing component 62*a* define base portion 102 and at least a portion of lip 106, respectively.

Figure 9B:
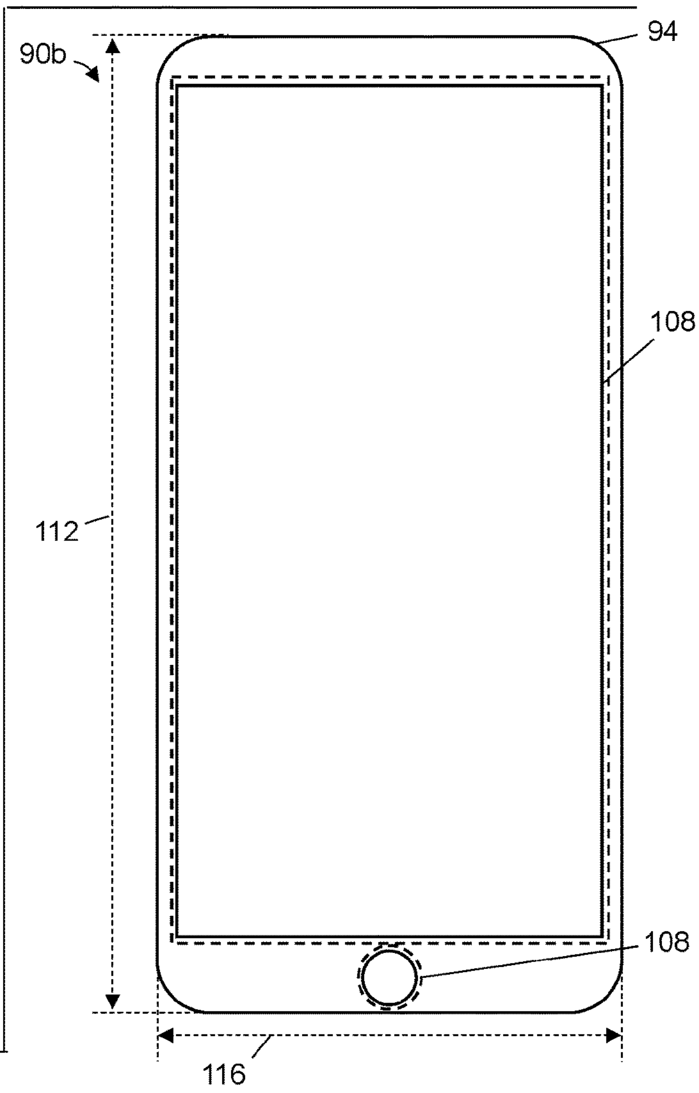
FIGS. 9A and 9B are schematic side and top views, respectively, of a portable electronic device (e.g., a phone or a tablet) comprising a polymer-ceramic composite housing.
Figure 9A:
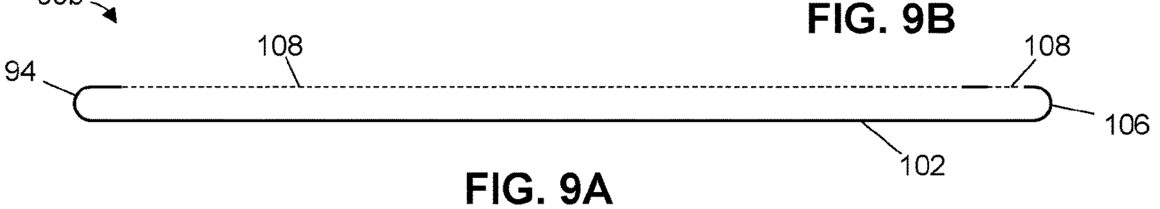

Referring to FIGS. 9A and 9B, shown is a portable electronic device 90*b* that can comprise a phone or a tablet. Device 90*b* can have a housing 94 that is substantially similar to the housing of wearable device 90*a*, the primary exception being that the housing of device 90*b* is shaped and sized to accommodate components of a phone or tablet. For example, length 112 of housing 94 can be greater than or equal to or between any two of 75, 100, 125, 150, 175, or more millimeters (e.g., if a phone) (e.g., between 125 and 150 mm) or 175, 200, 225, 250, 275, 300, or more millimeters (e.g., if a tablet) (e.g., between 220 and 260 mm). Width 116 of housing 94 can be greater than or equal to, or between any two of 35, 45, 55, 65, 75, 85, or more millimeters (e.g., if a phone) (e.g., between 65 and 85 mm) or 100, 125, 150, 175, 200, or more millimeters (e.g., if a tablet) (e.g., between 170 and 200 mm). As shown, housing 94 defines at least two openings to accommodate a screen and one or more user-input devices (e.g., a button, a camera, a microphone, and/or the like). Housing 94 can comprise one or more housing components (e.g., 62) (not shown), and can have any of the shapes described above with respect to wearable device 90*a*.

Figure 10A:
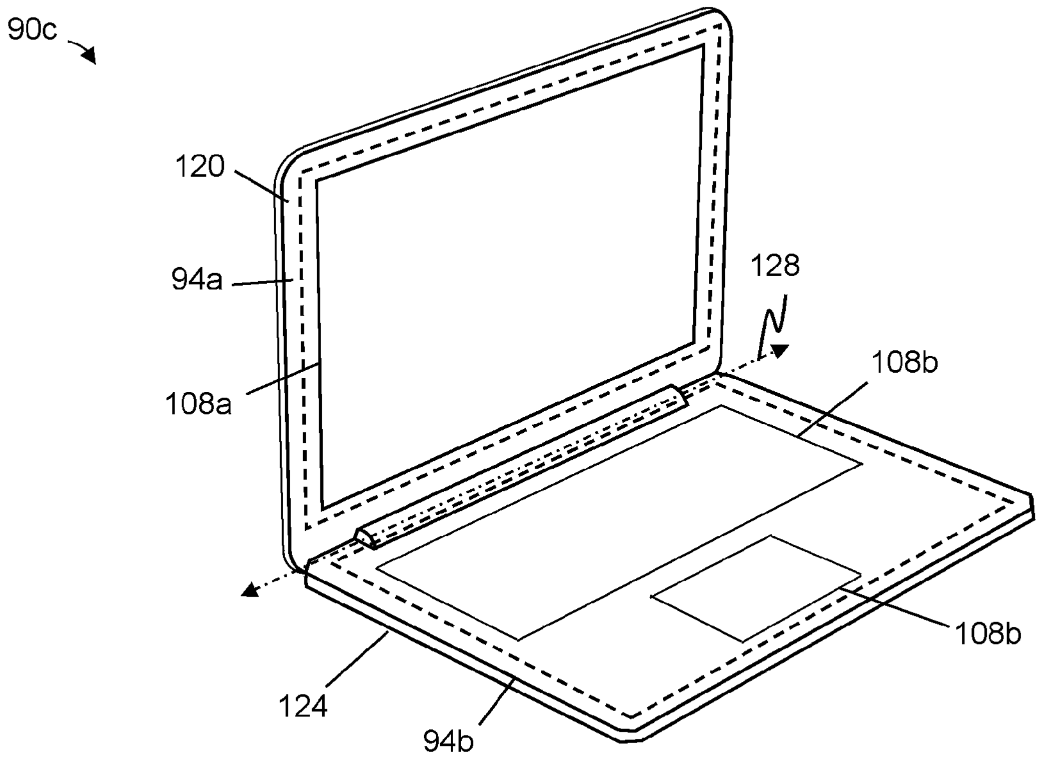
FIG. 10A is a schematic perspective view of a laptop that has a lid and a base, each comprising a housing manufactured according to some of the present methods.
Figure 10B:
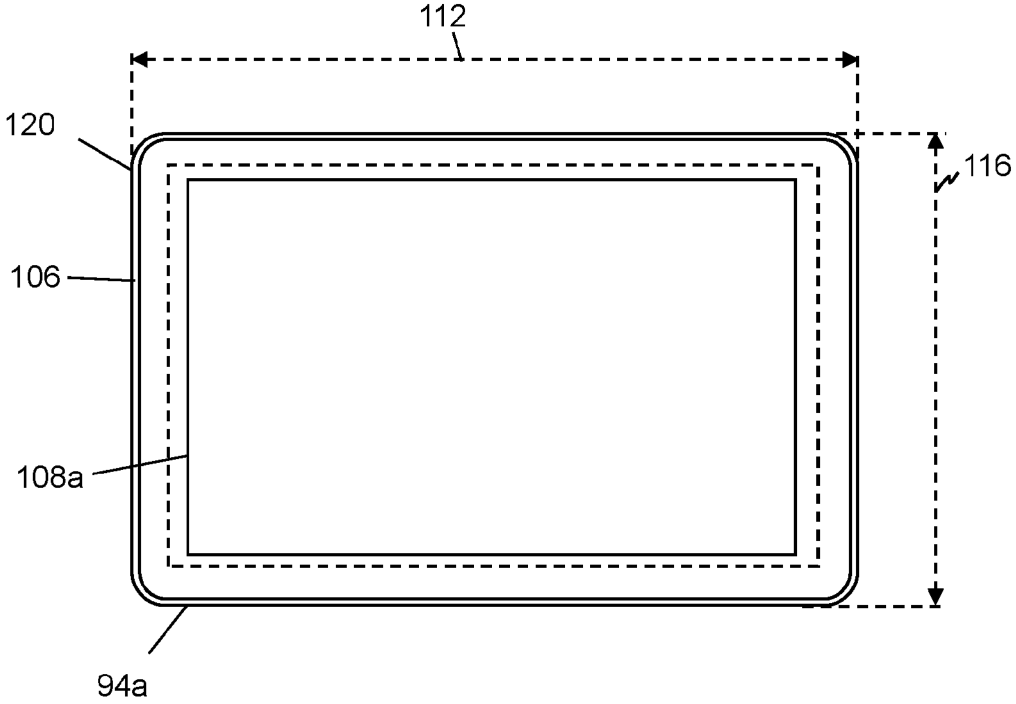
FIG. 10B is a schematic top view of the lid of FIG. 10A.

Referring to FIGS. 10A and 10B, shown are a schematic perspective view of a laptop 90*c* and a schematic top view of a lid 120 of the laptop, respectively. Laptop 90*c* includes a base 124 and a lid 120 that can be movably (e.g., hingedly, in this embodiment) coupled to the base, each comprising a housing (94*a* and 94*b*, respectively) substantially similar to the housing of wearable device 90*a*, the primary exception being that housings 94*a* and 94*b* are shaped and sized to accommodate components of a laptop. For example, laptop components receivable by housing 94*b* of base 124 can include a processor, motherboard, power supply, user-input device(s) (e.g., a keyboard, touchpad, and/or the like), cooling fan(s), and/or the like. To facilitate operation of such laptop components once they are received by base 124, housing 94*b* can define one or more openings 108*b* in communication with its interior (e.g., to allow user access to the user-input device(s), permit airflow to and/or from the cooling fan(s), allow external device(s) to be connected to the motherboard, and/or the like). Housing 94*b* can comprise an assembly of two or more housing components (e.g., 62*a* and 62*b*, not shown) to, for example, facilitate receipt of such laptop components by the base (e.g., during assembly of a laptop including the base). Laptop components receivable by lid 120 can include a screen, user-input device(s) (e.g., a camera, microphone, and/or the like), and/or the like. For example, housing 94*a* of lid 120 can define an opening 108*a*, where a laptop screen can be coupled to the frame such that the screen is viewable by a user through the opening. Lid 120 can comprise a single housing component (e.g., 62, not shown).

Housing 94*a* of lid 120 can have a length 112 and a width 116 that is smaller than the length. As shown, housing 94*a* is a rectangle having rounded corners, but in other embodiments can have any shape described above in reference to wearable device 90*a*. Length 112 can be, for example, greater than or equal to, or between any two of, 200, 250, 300, 350, 400, 450, or more millimeters (e.g., between 275 and 375 mm) and width 116 can be, for example, greater than or equal to, or between any two of, 125, 150, 175, 200, 225, 250, 275, 300, or more millimeters (e.g., between 175 and 235 mm). Housing 94*b* of base 124 can have substantially the same length, width, and shape as housing 94*a*.

In some configurations, it is beneficial to overmold a polymer on a surface of a polymer-ceramic composite. For example, when a housing (e.g., 94) comprises at least first and second ones of the housing components (e.g., 62*a* and 62*b*), the housing components can be joined in any suitable manner using, for example, bonds, adhesive, screws, bolts, connectors, and/or the like to complete the housing. By way of example, in the present configurations, the housing or housing components comprise one of the present polymer-ceramic composites (e.g., molded from one or more of the present polymer-ceramic core-shell particles), and the overmolded component can comprise a polymer selected from the group of polymers consisting of: PPE, PPS, PC copolymers, PEI, PEI copolymers, PPSU, PAES, PES, PBT, PP, PEE, SC PI, SC polyamide, polyethylene terephthalate (PET), polyoxymethylene (POM), and PC/acrylonitrile butadiene styrene (ABS). In some configurations, the polymer of the overmolded component may include a filler such as glass fibers and/or carbon fibers.

Referring to FIGS. 11A-11D, the housing can be formed by overmolding the housing components using, for example, an injection mold (e.g., 132). Mold 132 can comprise two or more mold portions (e.g., 136*a* and 136*b*), where at least one of the mold portions is movable relative to the other of the mold portions such that the mold is movable between an open state (FIG. 11A) and a closed state (FIG. 11B) in which the mold portions define mold cavity 140.

Figure 11A:
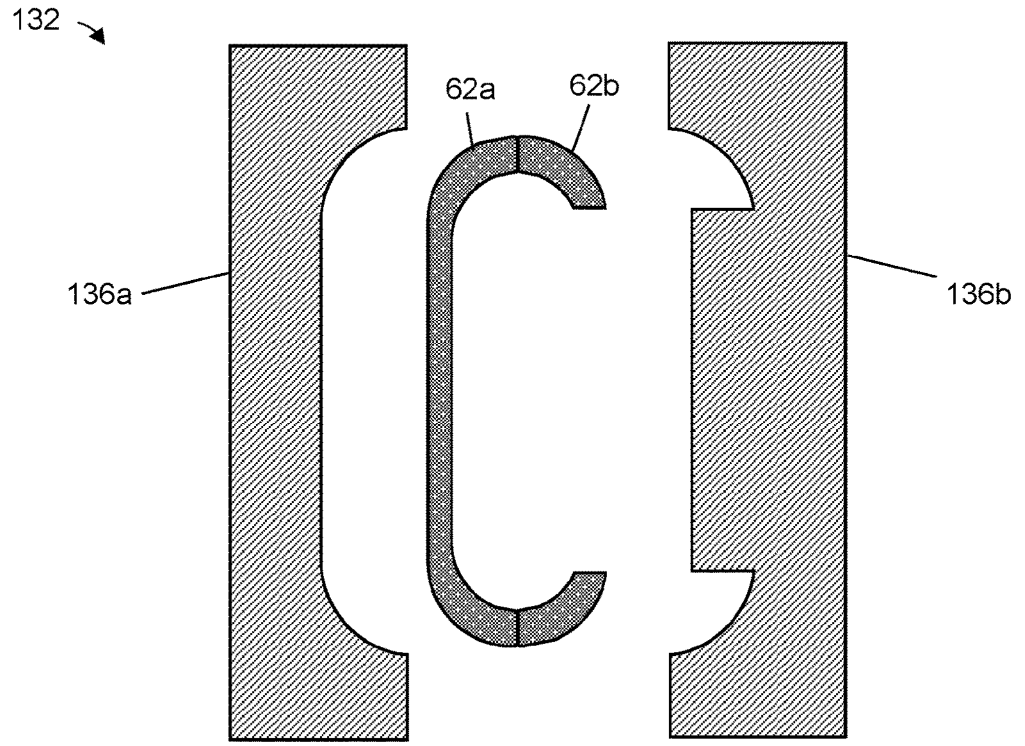
FIGS. 11A-11C are schematic views of a mold that can be used to perform overmolding of two or more housing components.
Figure 11B:
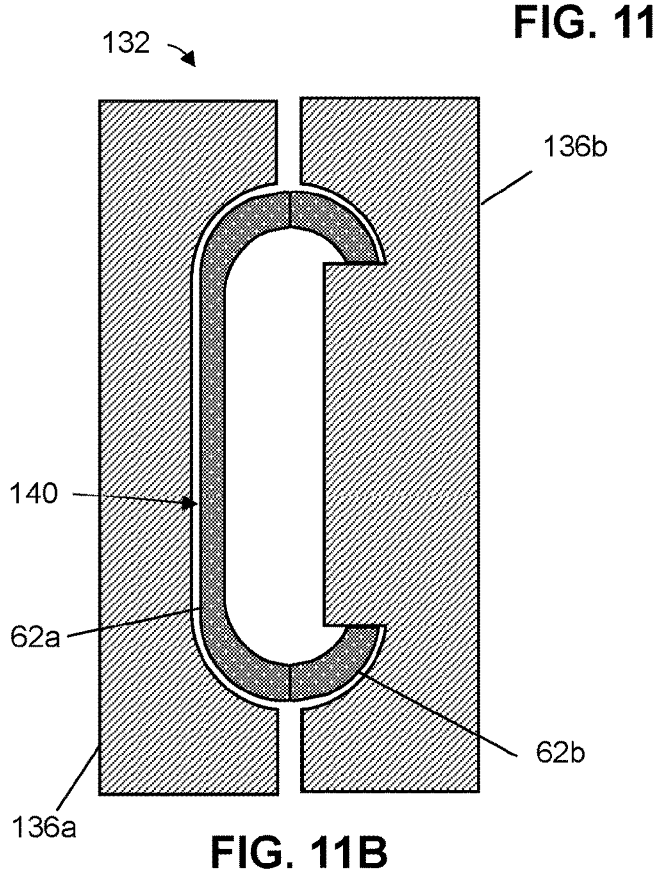
Figure 11C:
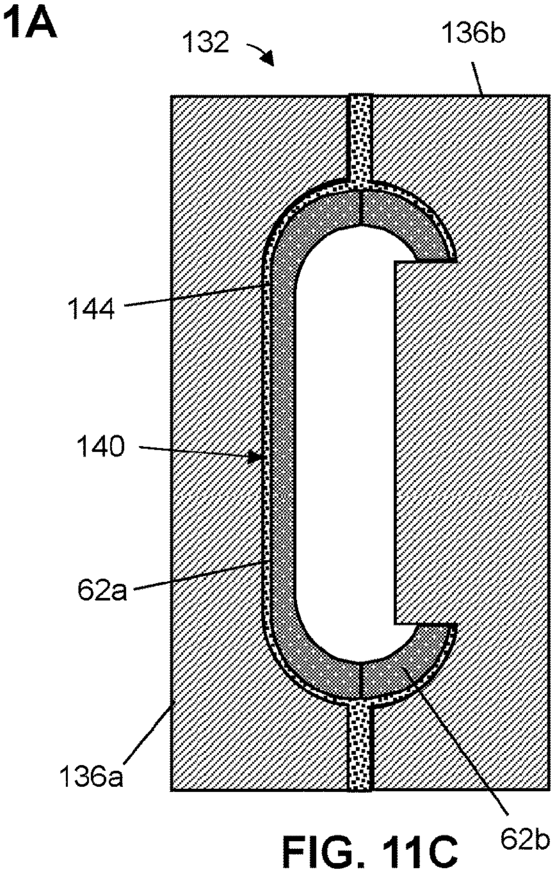
Figure 11D:
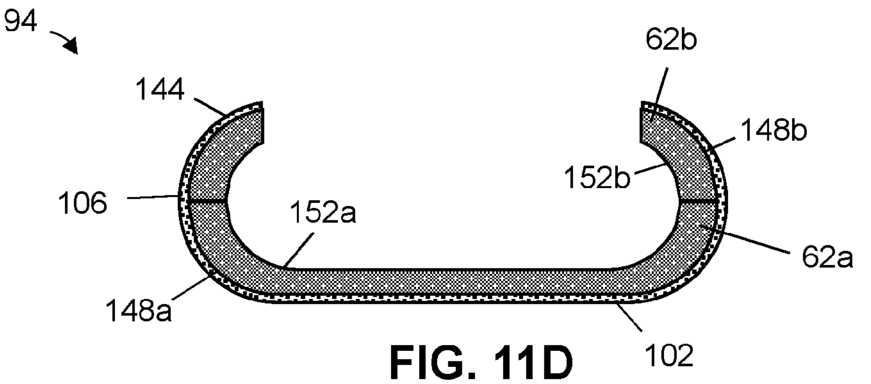
FIG. 11D is a schematic sectional view of a housing manufactured according to some of the present methods and comprising two housing components joined with an overmolded polymeric material.

Overmolding can comprise moving the mold to the closed state such that at least the first and second housing components are at least partially disposed within the mold cavity. The housing components can be joined at least by injecting polymeric material (e.g., 144) into the mold cavity to at least partially cover one or more surfaces of each of the housing components with the polymeric material (FIG. 11C). For example, each of the housing components can have opposing outer (e.g., 148*a* or 148*b*) and inner (e.g., 152*a* or 152*b*) surfaces, the inner surface configured to be disposed within the cavity of the housing defined by the base portion (e.g., 102) and lip (e.g., 106). As shown, overmolding is performed such that the polymeric material covers the outer surface of each of the housing components (FIG. 11D). In other embodiments, however, overmolding can be performed such that, for each of the housing components, the polymeric material partially or completely covers the inner surface additionally or alternatively to the outer surface. The polymeric material can comprises one or more of a thermoplastic material and a thermosetting material.

Figure 12A:
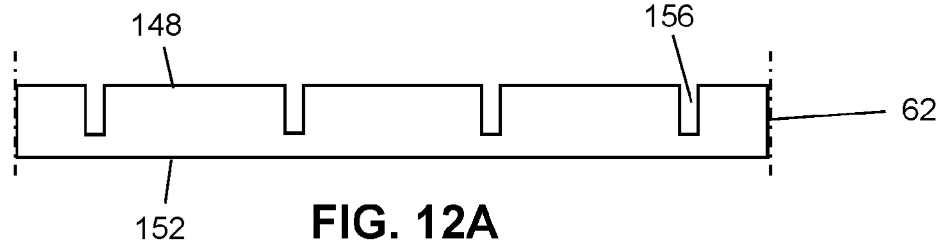
FIG. 12A is a schematic, partial sectional view of one of the housing component of FIG. 7D taken along line 12A-12A, which sectional view shows channels on a surface.
Figure 12B:
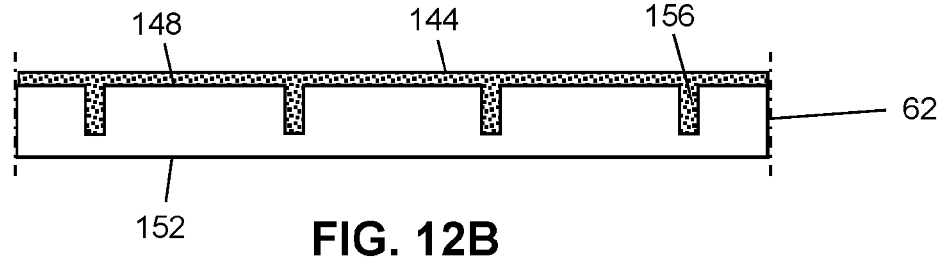
FIG. 12B is a schematic, partial sectional view of the housing component of FIG. 7D when the housing component is overmolded with polymeric material.

Referring to FIGS. 12A and 12B, the surface(s) of the housing component to be covered by the polymeric material (e.g., outer surface 148 and/or inner surface 152) can define one or more channels (e.g., 156). The channels can promote bonding between the housing component and the polymeric material. Formation of the channels can be facilitated by the composition of the polymer-ceramic composite housing component. For example, polymer within the polymer-ceramic composite can improve the machinability of the housing component such that the channel(s) are formable by etching (e.g., with a solvent) and/or milling the housing component. Overmolding can be performed such that the polymeric material, when injected, enters at least a portion of each of the channel(s) (FIG. 12B).

Figure 13A:
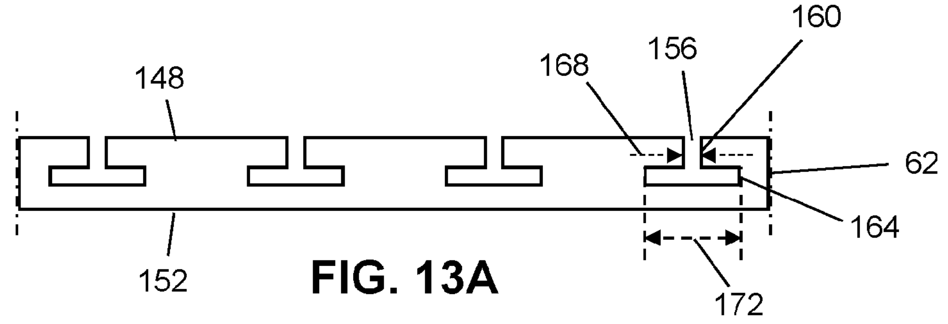
FIG. 13A is a schematic, partial sectional view of one of the present housing components wherein channels defined by a surface of the housing component have a first portion disposed closer to the surface than a second portion and the channel is wider in the second portion than in the first portion.
Figure 13B:
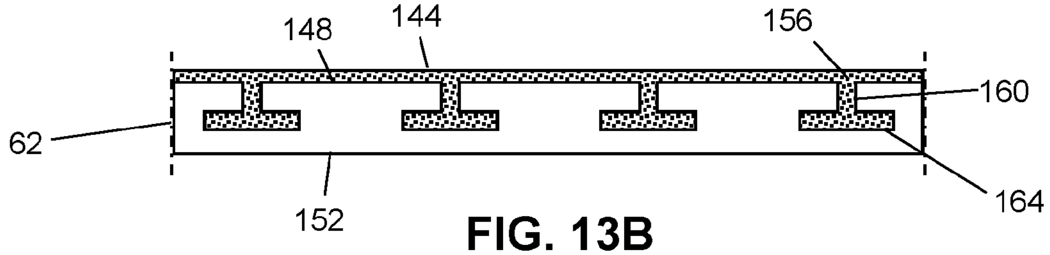
FIG. 13B is a schematic, partial sectional view of the housing component of FIG. 10A when the housing component is overmolded with polymeric material.

Referring to FIGS. 13A and 13B, each of the channel(s) can be milled such that the channel has a first portion (e.g., 160) and a second portion (e.g., 164), the first portion disposed closer to the surface than is the second portion (e.g., in a depth-wise direction). The channel can have a width (e.g., 168) within the first portion that is smaller than a width of the channel (e.g., 172) within the second portion, each of the widths measured perpendicularly to the largest dimension (e.g., length) of the channel. For example, width 172 can be greater than or equal to, or between any two of, 10%, 20%, 30%, 40%, 50%, 60%, 70%, 80%, 90%, 100%, or larger than width 168. Each of the channel(s) can thereby be "T-shaped" to promote bonding between the housing component and the overmolded polymeric material.

Figure 24:
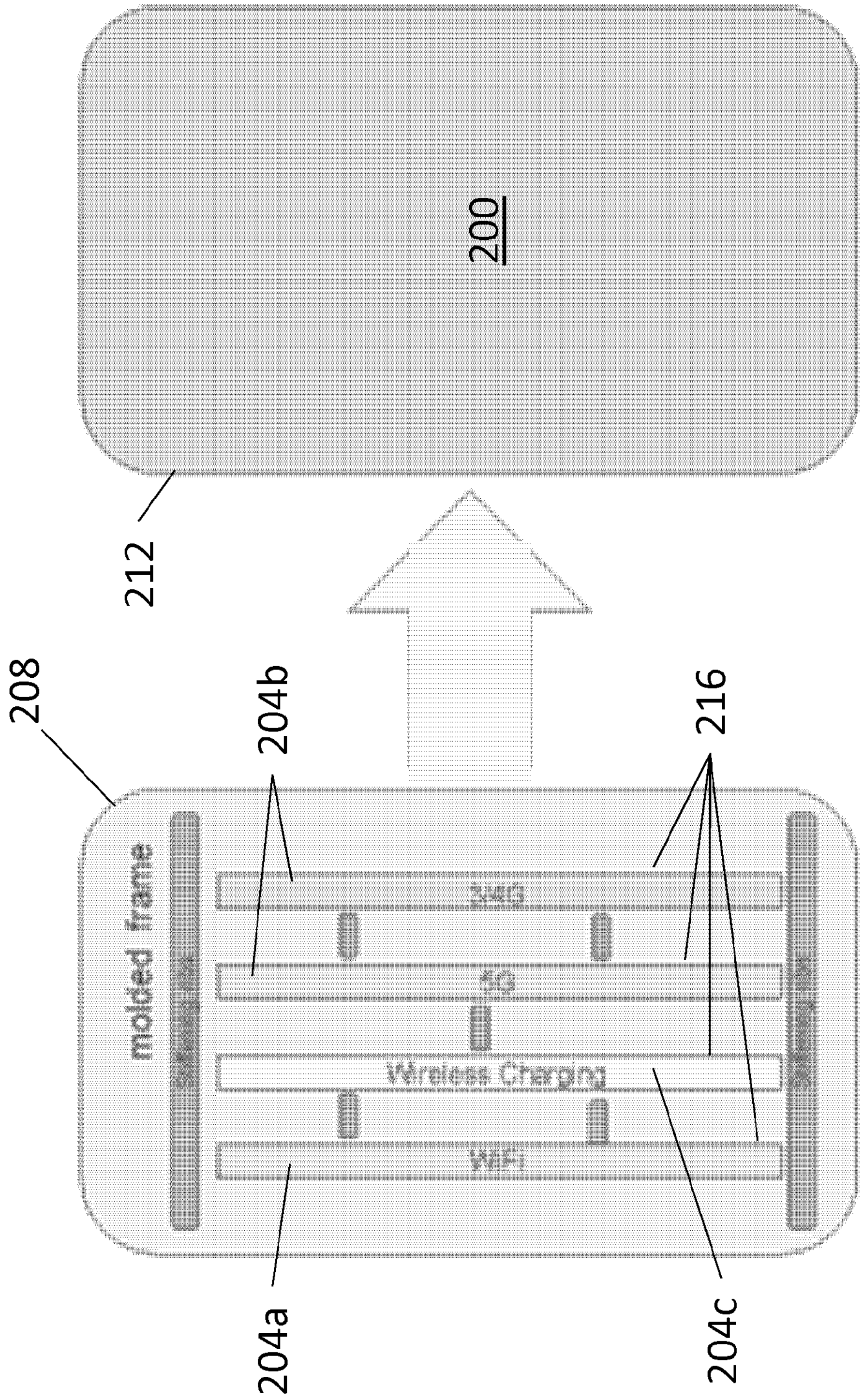
FIG. 24 depicts a schematic view of a housing part for a portable electronic device having a housing component, an overmolded component, and an electronic component disposed at least partly between the housing component and the overmolded component.

Referring to FIG. 24, in some configurations of the present housing parts (e.g., 200) one or more electronic components (e.g., 204) can be disposed at least partly between a housing component (e.g., 208) and an overmolded component (e.g., 212), for example, with the electronic component disposed in or aligned with a groove or depression (e.g., 216) in the housing component (e.g., 208). In such configurations, the housing component (e.g., 208) is compressed such as described for the below examples (either in a compression molding process, or injection molded and subsequently compressed), and the overmolded component (e.g., 212) is molded over the housing component (e.g., injection molded without additional compression beyond typical injection molding pressures). For example, the one or more electronic components can be selected from the list of electronic components consisting of: a printed circuit board, a wifi antenna (e.g., 204*a*), a cellular antenna (e.g., 204*b*), an inductive charging circuit (e.g., 204*c*), a sensor (e.g., GPS sensor, accelerometer, and/or the like), and a piezoelectric element, and a haptic feedback element.

EXAMPLES

1. Example 1: Powder of PPO-$Al_2O_3$Core-Shell Particles

Materials: 14.93 grams (g) Alumina ($Al_2O_3$), 2.66 g PPO, 180 g MEK (split into 140 g and 40 g portions). Relative amounts of Alumina and PPO resulted in Alumina being about 60% by volume of the formed core-shell particles.

Procedure: The Alumina was homogenized in the 140 g portion of the MEK in a 600 mL beaker using an IKA homogenizer (available from IKA Works, Inc. (Wilmington, NC USA)) for 5 minutes at 15,000 revolutions per minute (rpm). A small amount of the 40 g portion of the MEK was then used to rinse the homogenizer head to remove residual Alumina from the homogenizer head. The Alumina and MEK mixture, and the PPO, were then added to a 600 mL PARR™ reactor shell/container with agitator. Some of the remainder of the 40 g portion of the MEK was used to rinse the beaker, with all of the MEK then being added to the PARR™ reactor shell. The PARR™ reactor shell was then attached to the PARR™ reactor unit and the reactor controller was powered on. A line from a nitrogen ($N_2$) source was then attached to the head-space port of the PARR™ reactor shell, and the headspace in the shell purged several times with $N_2$. During the purging process, the pressure in the reactor shell was observed to ensure a tight seal. In particular, it was known that the $N_2$ in a sealed reactor shell would typically reach 80-95 psi. As such, once the $N_2$ was added to the headspace, the $N_2$ source was turned off and all of valves on the PARR™ reactor were closed. When the pressure remained substantially constant after about 45 seconds(s), the pressure was released and the headspace purged with $N_2$ two or three total times. If instead the pressure decreased, the pressure was released, the unit tightened again, and the process repeated until the pressure remained constant and the headspace could be thereafter purged the two or three total times. After the headspace was purged, the thermocouple was inserted into the temperature port on the reactor shell, and the cooling water line for the agitator was opened or turned on. The locking ring was then added around the point at which the shell attached to the rest of the PARR™ reactor unit and tightened as much as possible by hand. The heater was then aligned with and secured around the reactor shell.

Figure 14A:
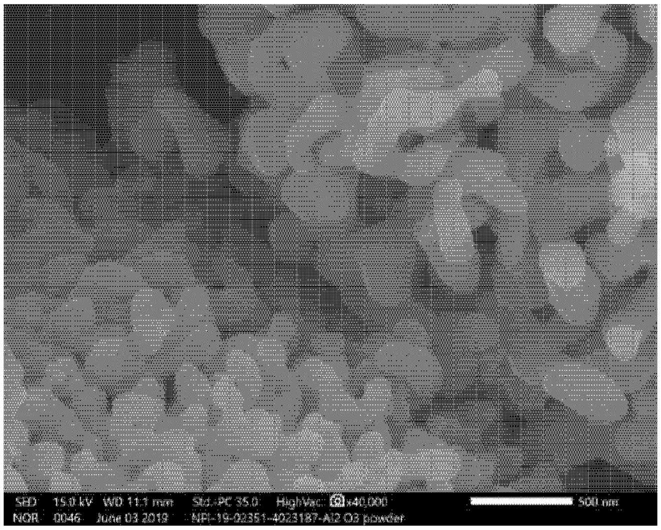
FIGS. 14A, 14B, and 14C are scanning electron microscope (SEM) images of uncoated $Al_2O_3$ particles, PPE-$Al_2O_3$ core-shell particles, and a compression-molded composite parts made from a powder of the PPE-$Al_2O_3$ core-shell particles.
Figure 14B:
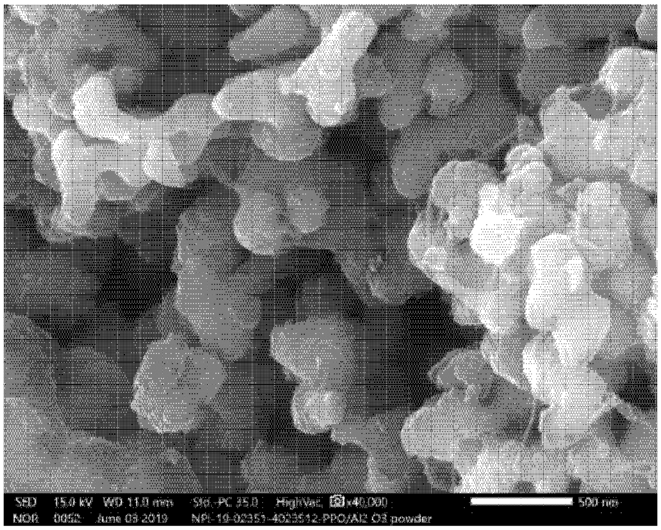

On the reactor controller, the primary temperature was then set to 140° C., the high limit pressure was set to 180 psi, the high limit temperature was set to 200° C. The heater was then set to Setting II (highest heat setting) and the agitator/impellor turned on and set to ~250 rpm. Once the temperature reached ~85° C., the heater was turned down to Setting I to allow for the maintenance of a more consistent temperature at 140° C. (to avoid the temperature fluctuating higher or lower than 140° C.). Once the thermocouple indicated the mixture in the reactor shell had reached 140° C., the reactor was held at that temperature for 30 minutes (min) while agitation continued. Reaction pressure at this temperature was about 75 psi or less, but in other implementations could be managed to be as high as 100 psi. After 30 minutes, the heater was turned off and the mixture allowed to cool to a temperature below 60° C. (time permitting, the mixture could be allowed to cool to 50° C.) to ensure that all PPO had precipitated. Once below 60° C., the pressure was typically at about 5 psi. The pressure release valve was then slowly turned to lower the pressure to ~0 psi. Once the pressure was relieved, the agitator was turned off, the reactor controller was turned off, and the cooling water line was turned off. The heater was then removed and the shell disengaged from the rest of the PARR™ reactor unit. The mixture in the reactor shell was then poured into a small beaker, and about an additional 100 milliliters (mL) of MEK was used to rinse residual material from the interior of the reactor shell for transfer to the beaker. The material in the beaker was then poured into a Buchner funnel and filter flask setup with a Whatman GF/F glass microfibre filter paper. The filtered wet cake was then rinsed with about 250 mL of Methanol (MeOH), and placed into an aluminum pan and dried under vacuum at 150° C. overnight. FIG. 14A depicts Alumina particles, and FIG. 14B depicts the PPO-Alumina core-shell particles. Certain properties of the resulting dry powder of PPO-$Al_2O_3$ core-shell particles were then measured and are included in Tables 1 and 2 below.

2. Example 2: Powder of PPO-$ZrO_2$ Core-Shell Particles

Materials: 21.38 grams (g) Zirconia ($ZrO_2$), 2.66 g PPO, 180 g MEK (split into 140 g and 40 g portions). Relative amounts of Zirconia and PPO resulted in Zirconia being about 60% by volume of the formed core-shell particles.

Figure 15A:
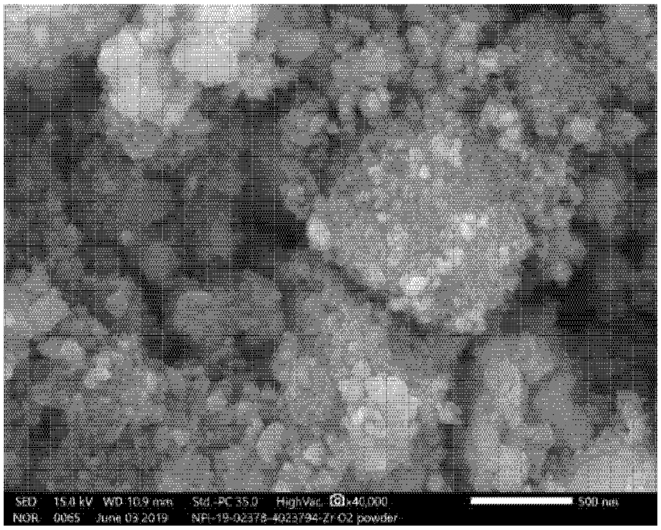
FIGS. 15A, 15B, and 15C are scanning electron microscope (SEM) images of uncoated $ZrO_2$ particles, PPE-$ZrO_2$ core-shell particles, and a compression-molded composite parts made from a powder of the PPE-$ZrO_2$ core-shell particles.
Figure 15B:
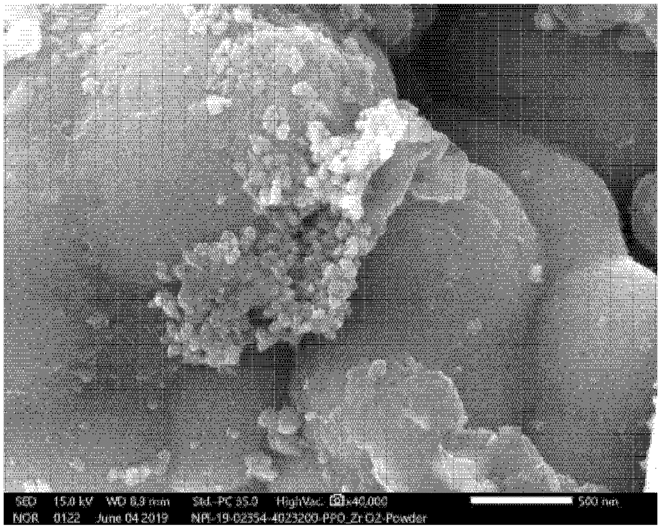

Procedure: The procedure for this Example 2 was substantially the same as that described above for Example 1, with the exception that Zirconia ($ZrO_2$) was used in place of Alumina ($Al_2O_3$). FIG. 15A depicts Zirconia particles, and FIG. 15B depicts the PPO-Zirconia core-shell particles. Certain properties of the resulting dry powder of PPO-$ZrO_2$ core-shell particles were then measured and are included in Tables 1 and 2 below.

3. Example 3: Compression Molded Pellet of PPO-$Al_2O_3$Core-Shell Particles

Materials: 1.2 g of a dry powder of PPO-$Al_2O_3$ core-shell particles as produced in Example 1 described above.

Figure 14C:
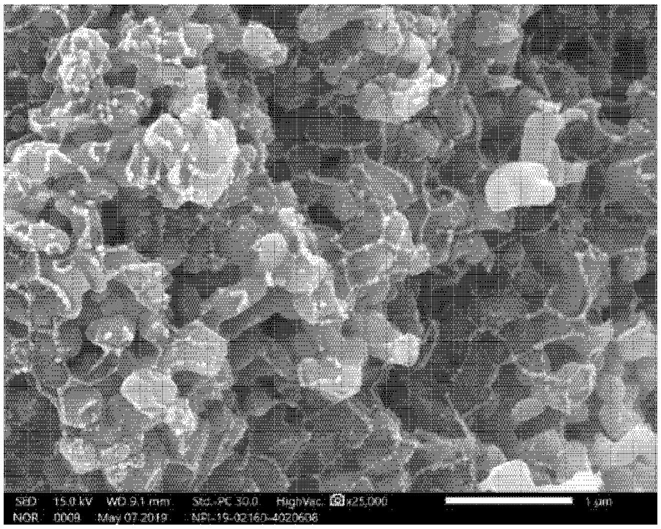

Procedure: 1.2 g of the powder was measured into an aluminum pan. Using a paper funnel, the powder was then poured into a circular cylindrical die of 13 millimeter (mm) internal diameter. The powder was then lightly compacted in the die using a rod, and a heating jacket was mounted around the die. The die was then heated to a first temperature of either 270° C. or 300° C., and maintained at the first temperature for five (5) minutes. A hydraulic press was then used to apply to the powder a pressure of 5 tons or 370 MPa. The mold was then held at the first temperature, with the powder under pressure, for a period of thirty (30) minutes, after which the heater was turned off and the die allowed to cool while the pressure was maintained. After 30 minutes, the PPO-Alumina composite pellet was removed from the die, and the pellet weighed and its dimensions measured to calculate relative density. FIG. 14C depicts the microstructure of the compressed pellet, and certain characteristics of the pellets are included in Table 3 below.

4. Example 4: Compression Molded Pellet of PPO-$ZrO_2$ Core-Shell Particles

Materials: 2.0 g of a dry powder of PPO-$ZrO_2$ core-shell particles as produce in Example 2 described above.

Figure 15C:
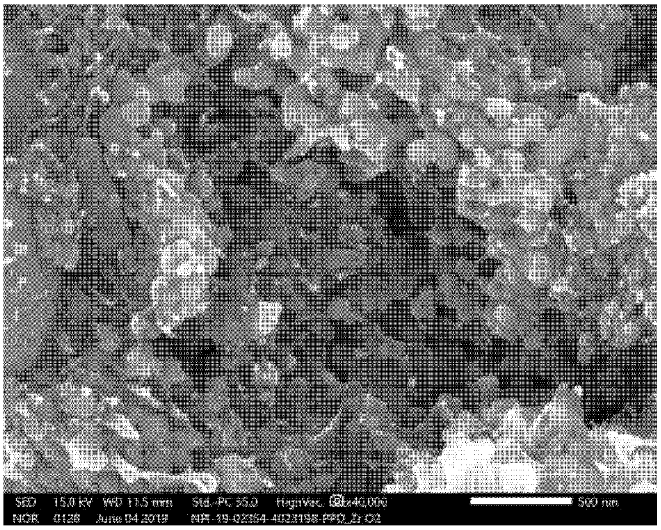

Procedure: The procedure for this Example 4 was substantially the same as that of Example 3, with the exception that PPO-$ZrO_2$ core-shell particles were used in place of PPO-$Al_2O_3$ core-shell particles. FIG. 15C depicts the microstructure of the compressed PPO-$ZrO_2$ pellet, and certain characteristics of the pellets are included in Tables 3 and 4 below.

5. Example 5: Compression Molded Plaque of PPO Particles

Materials: 10 g of PPE particles

Procedure: 10 g of PPE powder was measured into an aluminum pan. Using a paper funnel, the powder was then poured into a square cylindrical die of 50 mm×50 mm internal dimension. The powder was then lightly compacted in the die using a rod, and a heating jacket was mounted around the die. The die was then heated to a first temperature of 270° C., and maintained at the first temperature for five (5) minutes. A hydraulic press was then used to apply to the powder a pressure of 24 tons or 94 MPa. The mold was then held at the first temperature, with the powder under pressure, for a period of thirty (30) minutes, after which the heater was turned off and the die allowed to cool while the pressure was maintained, forming a PPO plaque having nominal dimensions of 50 mm×50 mm×3 mm. After 30 minutes, the PPO plaque was removed from the die, and the plaque weighed and its dimensions measured to calculate relative density. Certain properties of the resulting PPO plaque were then measured and are included in Tables 4 and 5 below.

6. Example 6: Compression Molded Plaque of PPO-$Al_2O_3$Core-Shell Particles

Materials: 17 g of a dry powder of PPO-$Al_2O_3$ core-shell particles as produced in Example 1 described above.

Procedure: The procedure for this Example 6 was substantially the same as that described above for Example 5, with the exception that PPO-Alumina powder was used in place of the PPO powder. Certain properties of the resulting PPO-Alumina plaque were then measured and are included in Tables 4 and 5 below.

7. Example 7: Compression Molded Pellet of PPO-$Al_2O_3$Core-Shell Particles

Materials: 1.2 g of a dry powder of PPO-$Al_2O_3$ core-shell particles as produced in Example 1 described above.

Procedure: The procedure for this Example 7 was substantially the same as that described above for Example 3, with the exception that a 35 mm die was used instead of a 13 mm die. Certain properties of the resulting PPO-Alumina plaque were then measured and are included in Table 5 below.

8. Example 8: Compression Molded Pellet of PPO-$Al_2O_3$Core-Shell Particles and PPO-$ZrO_2$ Core-Shell Particles Materials: 0.7 g of a dry powder of PPO-$Al_2O_3$ core-shell particles as produced in Example 1 described above, mixed with 0.5 g of a dry powder of PPO-$ZrO_2$ core-shell particles as produced in Example 2 described above. These two powders were placed in a mortar and mixed with a pestle for a period of two minutes.

Figure 16A:
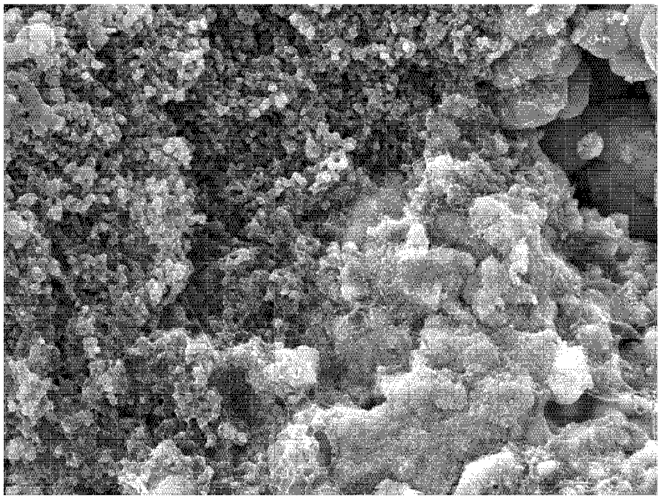
FIG. 16A is a scanning electron microscope (SEM) images of a portion of a compression-molded composite part made from a mixture of a powder of the PPE-$Al_2O_3$ core-shell particles, and a powder of the PPE-$ZrO_2$ core-shell particles.
Figure 16B:
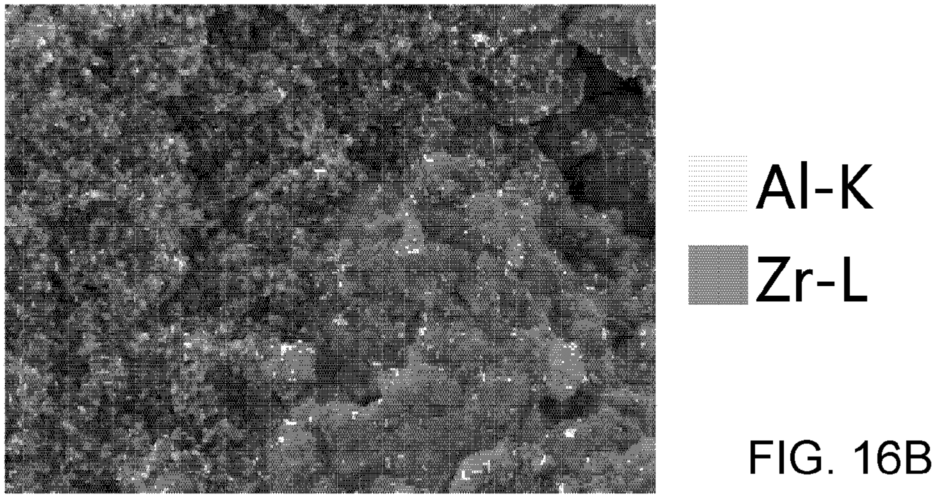
FIG. 16B is the image of FIG. 9A with a PPE-$Al_2O_3$ portion shaded on the left, and a PPE-$ZrO_2$ portion shaded on the right.
Figure 16C:
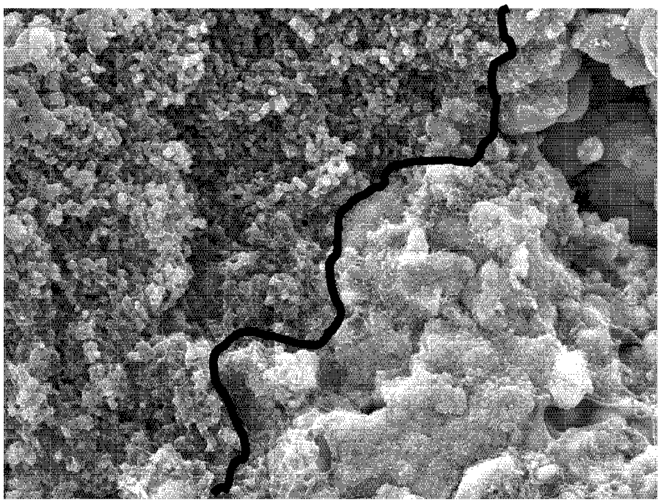
FIG. 16C is the image of FIG. 9A with a line illustrating the approximate boundary between the PPE-$Al_2O_3$ portion on the left, and a PPE-$ZrO_2$ portion on the right.

Procedure: The procedure for this Example 8 was substantially the same as that described above for Example 3, with the exception that the foregoing powder mixture was used in place of the pure PPO-$Al_2O_3$ core-shell particles used in Example 3. Certain properties of the resulting PPO-Alumina plaque were then measured and are included in Table 3 below. FIGS. 16A, 16B, and 16C depict the microstructure of the compressed pellet.

9 Example 9: Powder of PPS-$Al_2O_3$Core-Shell Particles

Materials: 11.67 grams (g) Alumina ($Al_2O_3$), 2.66 g PPS, 180 g NMP (split into 140 g and 40 g portions). Relative amounts of Alumina and PPS resulted in Alumina being about 60% by volume of the formed core-shell particles.

Figure 17A:
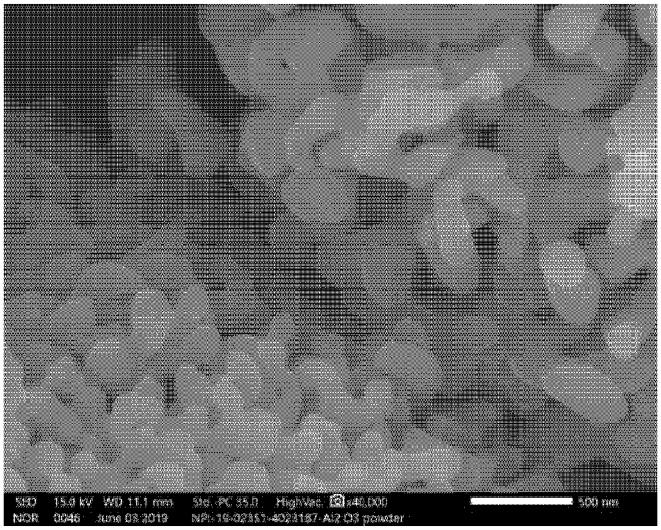
FIGS. 17A, 17B, and 17C are scanning electron microscope (SEM) images of uncoated $Al_2O_3$ particles, PPS-$Al_2O_3$ core-shell particles, and a compression-molded composite parts made from a powder of the PPS-$Al_2O_3$ core-shell particles.
Figure 17B:
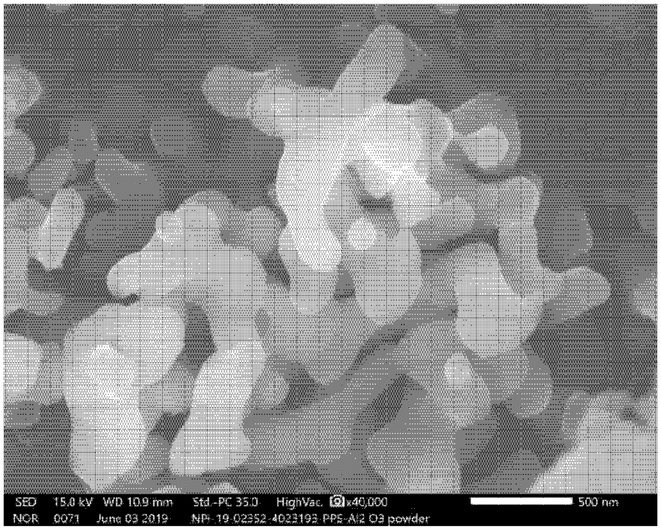

Procedure: The procedure for this Example 9 was substantially the same as that described above for Example 1, with the exception that NMP solvent was used instead of MEK solvent in the reactor, the primary temperature was set to 270° C. instead of 140° C., and the heater was shifted from Setting II to Setting I once the temperature reached 240° C. instead of 85° C., after the heater was turned off the mixture was allowed to cool to 100° C. instead of 60° C., NMP solvent was used for rinsing instead of MeOH solvent, and drying occurred at 200° C. instead of 150° C. FIG. 17A depicts Alumina particles, and FIG. 17B depicts the PPS-Alumina core-shell particles. Certain properties of the resulting dry powder of PPS-$Al_2O_3$ core-shell particles were then measured and are included in Tables 1 and 2 below.

10. Example 10: Compression Molded Pellet of PPS-$Al_2O_3$Core-Shell Particles

Materials: 2.0 g of a dry powder of PPS-$Al_2O_3$ core-shell particles as produced in Example 1 described above.

Figure 17C:
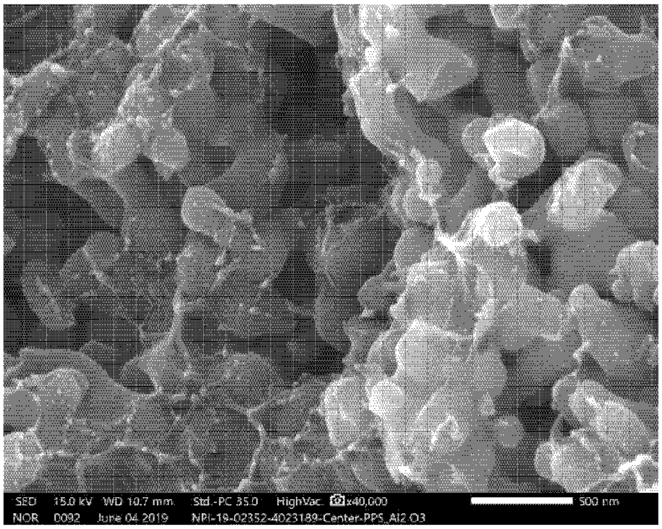

Procedure: The procedure for this Example 10 was substantially the same as that described above for Example 3, with the exception that PPS-$Al_2O_3$ core-shell particles were used instead of PPO-$Al_2O_3$ core-shell particles, temperatures of 280° C. or 300° C. were used instead of 270° C. or 300° C. FIG. 17C depicts the microstructure of the compressed pellet, and certain characteristics of the pellets are included in Table 3 below.

11. Example 11: Powder of PEI Copolymer-ZnO Core-Shell Particles

Materials: 17.34 grams (g) Zinc Oxide (ZnO), 2.66 g PEI copolymer pellets (ULTEM CRS5001, SABIC Innovative Plastics IP B.V.), 180 g ODCB (split into 140 g and 40 g portions). Relative amounts of Zinc Oxide and PEI copolymer resulted in Zinc Oxide being about 60% by volume of the formed core-shell particles.

Figure 18A:
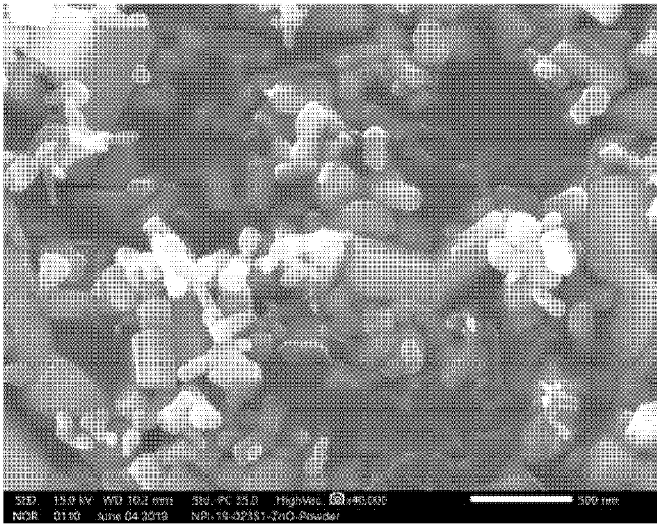
FIGS. 18A, 18B, and 18C, respectively, are scanning electron microscope (SEM) images of uncoated ZnO particles, PEI copolymer-ZnO core-shell particles, and a compression-molded composite parts made from a powder of the PEI copolymer-ZnO core-shell particles.
Figure 18B:
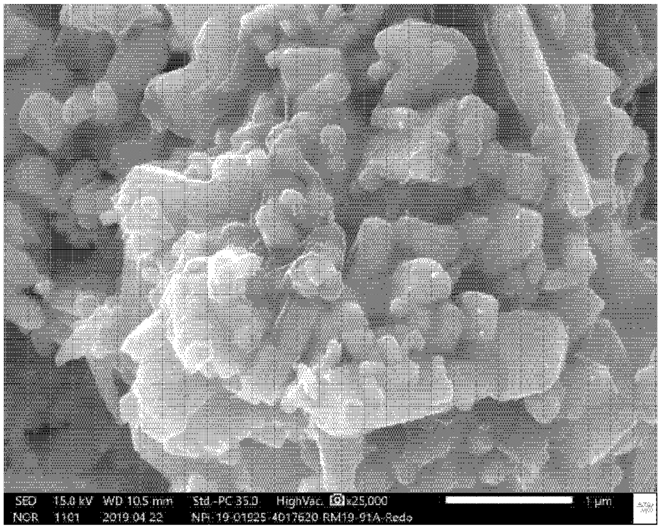

The procedure for this Example 11 was substantially the same as that described above for Example 1, with the exception that ODCB solvent was used instead of MEK solvent in the reactor, the primary temperature was set to 250° C. instead of 140° C., and the heater was shifted from Setting II to Setting I once the temperature reached 220° C. instead of 85° C., after the heater was turned off the mixture was allowed to cool below 110° C. instead of 60° C., ODCB solvent was used for rinsing instead of MeOH solvent, and drying occurred at 200° C. instead of 150° C. FIG. 18A depicts Zinc Oxide particles, and FIG. 18B depicts the PEI copolymer-Zinc Oxide core-shell particles. Certain properties of the resulting dry powder of PEI copolymer-ZnO core-shell particles were then measured and are included in Tables 1 and 2 below.

12. Example 12: Compression Molded Pellet of PEI Copolymer-ZnO Core-Shell Particles Materials: 3 g of a dry powder of CRS5001-ZnO core-shell particles as produced in Example 1 described above.

Figure 18C:
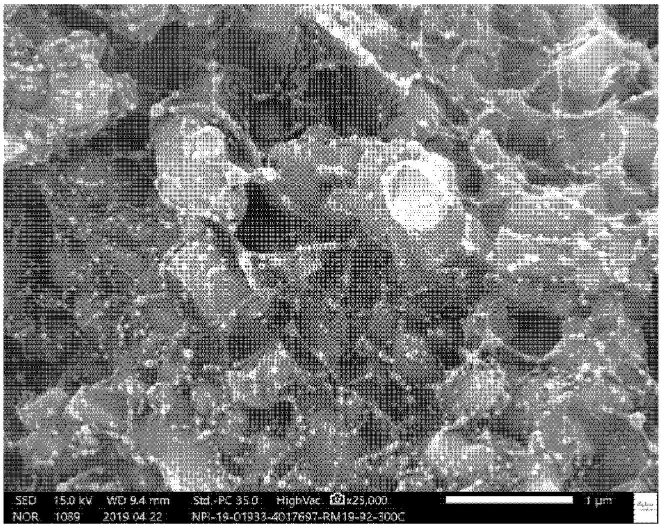

Procedure: The procedure for this Example 10 was substantially the same as that described above for Example 3, with the exception that PEI copolymer-ZnO core-shell particles were used instead of PPO-$Al_2O_3$ core-shell particles, a temperatures of 260° C. was used instead of 270° C. or 300° C. FIG. 18C depicts the microstructure of the compressed pellet, and certain characteristics of the pellets are included in Table 3 below.

13. Example 13: Powder of PEEK-$Al_2O_3$Core-Shell Particles (NMP Solvent)

Materials: 8.08 grams (g) Alumina ($Al_2O_3$), 1.92 g PEEK, 180 g NMP (split into 140 g and 40 g portions). Relative amounts of Alumina and PEEK resulted in Alumina being about 60% by volume of the formed core-shell particles.

Figure 19A:
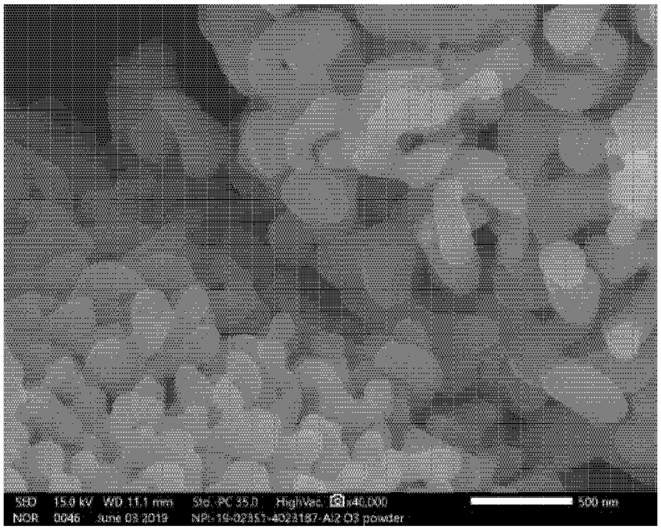
FIGS. 19A and 19B respectively are scanning electron microscope (SEM) images of uncoated $Al_2O_3$ particles, and PEEK-$Al_2O_3$ core-shell particles formed using NMP solvent.
Figure 19B:
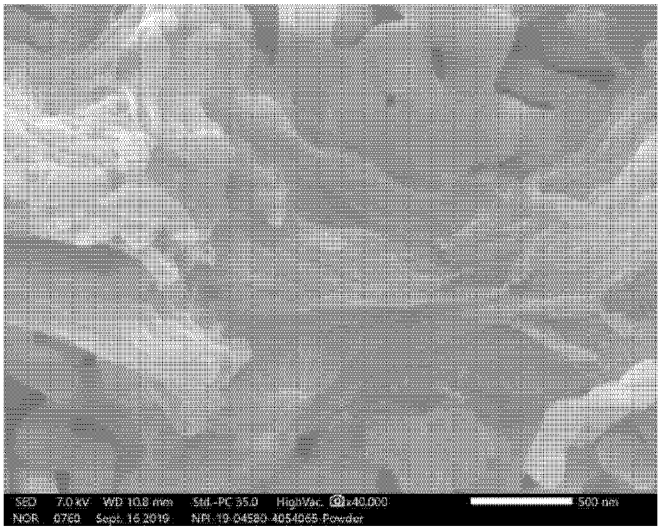

Procedure: The procedure for this Example 13 was substantially the same as that described above for Example 9, with the exceptions that PEEK was used in place of PPS, the Alumina was not homogenized prior to being mixed with the polymer in the PARR™ reactor shell, the primary temperature was set to 280° C. instead of 270° C., the agitator/impellor was set to 50 rpm instead of ~250 rpm, the reactor was held at temperature for 15 minutes instead of 30 minutes, the mixture was allowed to cool to 23° C. to ensure full precipitation instead of 100° C., and the core-shell particles were dried at 210° C. instead of 200° C. FIG. 19A depicts Alumina particles, and FIG. 19B depicts the PEEK-Alumina core-shell particles formed using NMP solvent. Certain properties of the resulting dry powder of PEEK-$Al_2O_3$ core-shell particles were then measured and are included in Table 1 below.

14. Example 14: Powder of PEEK-$Al_2O_3$Core-Shell Particles (ODCB Solvent)

Materials: 8.08 grams (g) Alumina ($Al_2O_3$), 1.92 g PEEK, 180 g ODCB (split into 140 g and 40 g portions). Relative amounts of Alumina and PEEK resulted in Alumina being about 60% by volume of the formed core-shell particles.

Figure 20A:
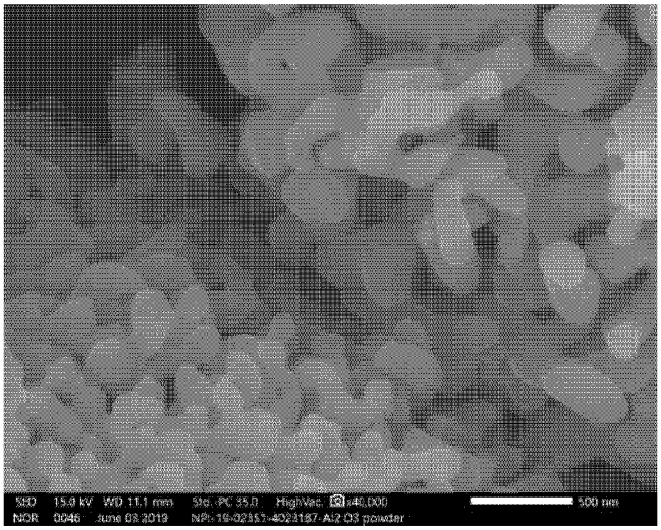
FIGS. 20A and 20B respectively are scanning electron microscope (SEM) images of uncoated $Al_2O_3$ particles, and PEEK-$Al_2O_3$ core-shell particles formed using ODCB solvent.
Figure 20B:
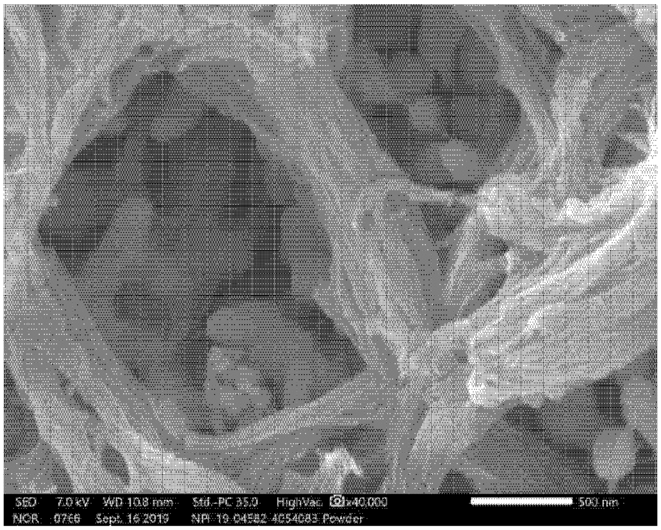

Procedure: The procedure for this Example 14 was substantially the same as that described above for Example 13, with the exception that ODCB solvent was used instead of NMP solvent. FIG. 20A depicts Alumina particles, and FIG. 20B depicts the PEEK-Alumina core-shell particles formed using NMP solvent. Certain properties of the resulting dry powder of PEEK-$Al_2O_3$ core-shell particles were then measured and are included in Table 1 below.

15. Example 15: Powder of PEEK-$Al_2O_3$Core-Shell Particles (ODCB Solvent)

Materials: 24.24 grams (g) Alumina ($Al_2O_3$), 5.76 g PEEK 270 g ODCB (split into 210 g and 60 g portions). Relative amounts of Alumina and PEEK resulted in Alumina being about 60% by volume of the formed core-shell particles. The PEEK was VICTREX® PEEK150G from Victrex plc, and the Alumina was MARTOXID® RN-405 from HUBER Engineered Materials.

Figure 21A:
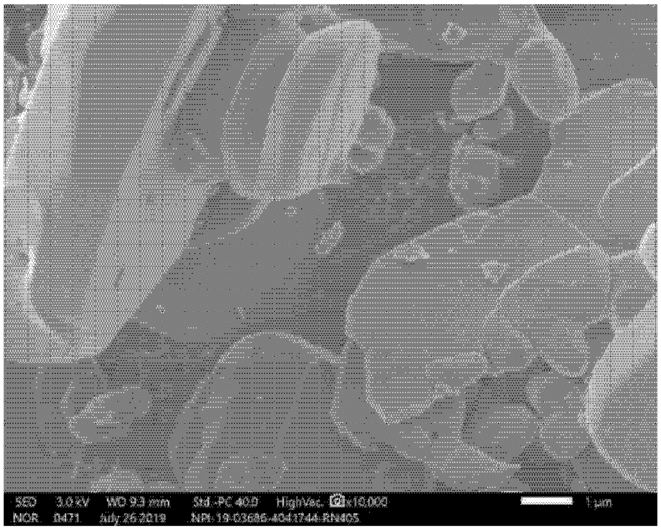
FIGS. 21A, 21B, and 21C respectively are scanning electron microscope (SEM) images of uncoated $Al_2O_3$ particles, of PEEK-$Al_2O_3$ core-shell particles formed using ODCB solvent, and a compression-molded composite part made from a powder of the PEEK-$Al_2O_3$ core-shell particles.
Figure 21B:
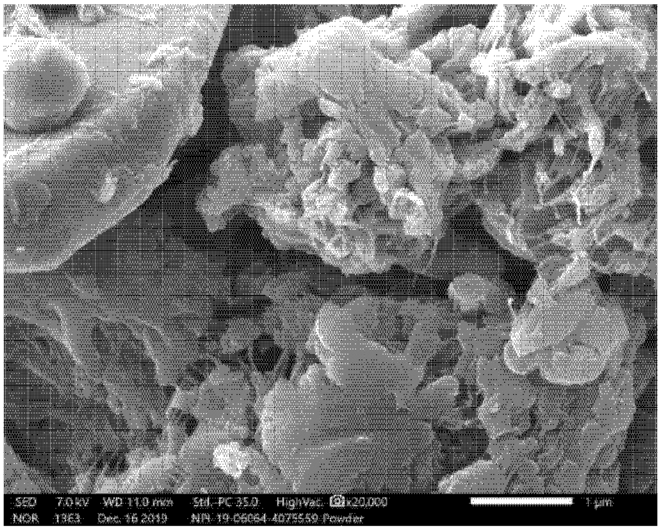

Procedure: The procedure for this Example 15 was substantially the same as that described above for Example 9, with the exceptions that PEEK was used in place of PPS, the primary temperature was set to 280° C. instead of 270° C., the mixture was allowed to cool to 23° C. to ensure full precipitation instead of 100° C., and the core-shell particles were dried at 210° C. instead of 200° C. FIG. 21A depicts the Alumina particles, and FIG. 21B depicts the PEEK-Alumina core-shell particles formed using ODCB solvent. Certain properties of the resulting dry powder of PEEK-$Al_2O_3$ core-shell particles were then measured and are included in Tables 1 and 2 below.

16. Example 16: Compression Molded Pellet of PEEK-$Al_2O_3$(ODCB) Core-Shell Particles Materials: 1.2 g of a dry powder of PEEK-$Al_2O_3$ core-shell particles as produced using ODCB solvent in Example 15 described above.

Figure 21C:
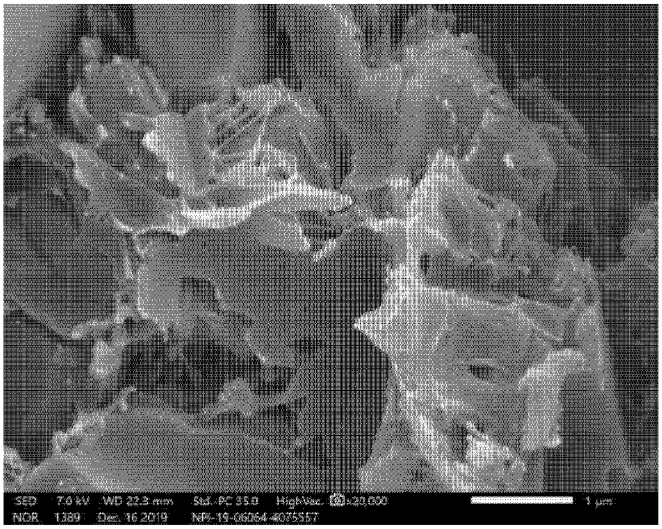

Procedure: The procedure for this Example 16 was substantially the same as that described above for Example 10, with the exception that PEEK-$Al_2O_3$(ODCB) core-shell particles were used instead of PPSU-$Al_2O_3$ core-shell particles. FIG. 21C depicts the microstructure of the compressed pellet, and certain characteristics of the pellets are included in Table 3 below.

17. Prophetic Example 17: Compression Molded Pellet of PEEK-$Al_2O_3$(NMP) Core-Shell Particles Materials: 1.2 g of a dry powder of PEEK-$Al_2O_3$ core-shell particles as produced using NMP solvent in Example 3 described above, except with the Alumina homogenized as described in Example 13 prior to being mixed with the polymer in the PARR™ reactor shell.

Procedure: The procedure for this Prophetic Example 17 will be substantially the same as that described above for Example 10, with the exception that PEEK-$Al_2O_3$(NMP) core-shell particles will be used instead of PEEK-$Al_2O_3$ (ODCB) core-shell particles, and the die will be heated to a temperature of 320° C. The compression molded pellet is expected to exhibit a relative density greater than 80% and/or greater than 90%.

18. Example 18: Compression Molded Pellet of PEEK-$Al_2O_3$Core-Shell Particles

Materials: 8.65 g of a dry powder of PEEK-$Al_2O_3$ core-shell particles as produced in Example 5 described above.

Procedure: The procedure for this Example 18 was substantially the same as that described above for Example 12, with the exceptions that a 35 mm die was used instead of a 13 mm die, PEEK-Alumina core-shell particles were used instead of PPS-Alumina core-shell particles, and the die was heated to a first temperature of 320° C. instead of 280° C. or 300° C. Certain properties of the resulting PEEK-Alumina pellet were then measured and are included in Table 4 below.

19. Example 19: Powder of PPSU-$Al_2O_3$Core-Shell Particles

Materials: 8.08 grams (g) Alumina ($Al_2O_3$), 1.95 g PPSU, 180 g ODCB (split into 140 g and 40 g portions). Relative amounts of Alumina and PPSU resulted in Alumina being about 60% by volume of the formed core-shell particles.

Figure 22A:
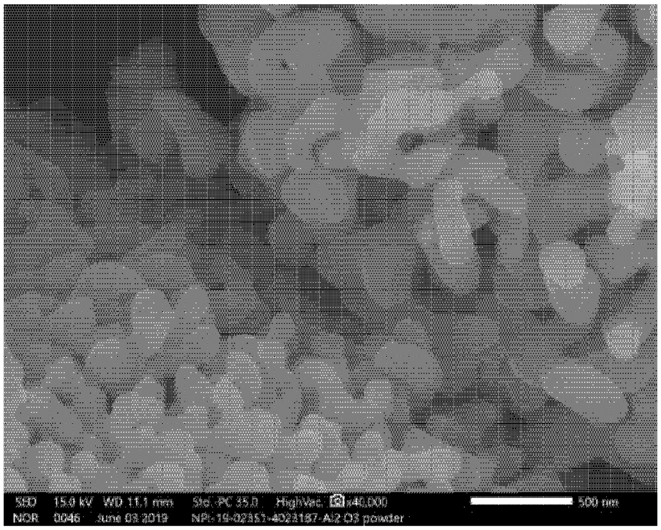
FIGS. 22A and 22B respectively are scanning electron microscope (SEM) images of uncoated $Al_2O_3$ particles, and of PPSU-$Al_2O_3$ core-shell particles.
Figure 22B:
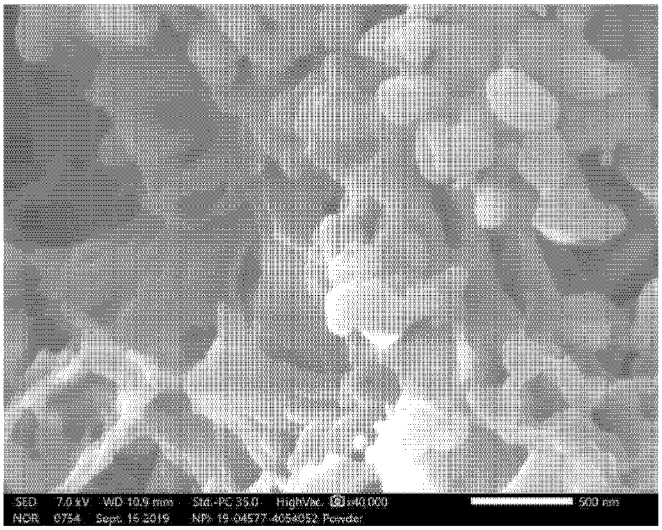

Procedure: The procedure for this Example 19 was substantially the same as that described above for Example 11, with the exception that PPSU was used in place of PEI copolymer, the agitator/impellor was set to 50 rpm instead of ~250 rpm, the reactor was held at temperature for 15 minutes instead of 30 minutes, the mixture was allowed to cool to 23° C. to ensure full precipitation instead of 100° C., and the core-shell particles were dried at 190° C. instead of 200° C. FIG. 22A depicts Alumina particles, and FIG. 22B depicts the PPSU-Alumina core-shell particles. Certain properties of the resulting dry powder of PPSU-$Al_2O_3$ core-shell particles were then measured and are included in Table 1 and 2 below.

20. Example 20: Powder of PPSU-$Al_2O_3$Core-Shell Particles

Materials: 8.05 grams (g) Alumina ($Al_2O_3$), 1.95 g PPSU, 180 g ODCB (split into 140 g and 40 g portions). Relative amounts of Alumina and PPSU resulted in Alumina being about 60% by volume of the formed core-shell particles. The PPSU was Radel® R5100 from Solvay, and the Alumina was MARTOXID® RN-405 from HUBER Engineered Materials.

Figure 23A:
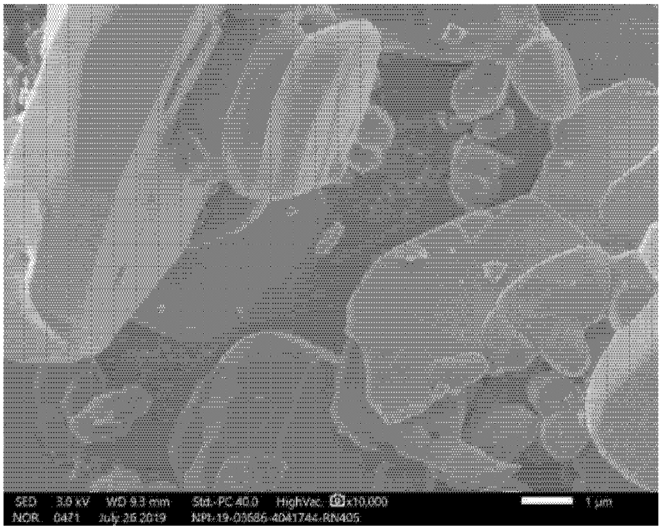
FIGS. 23A, 23B, and 23C respectively are scanning electron microscope (SEM) images of a second type of uncoated $Al_2O_3$ particles, of PPSU-$Al_2O_3$ core-shell particles, and a compression-molded composite part made from a powder of the PPSU-$Al_2O_3$ core-shell particles.
Figure 23B:
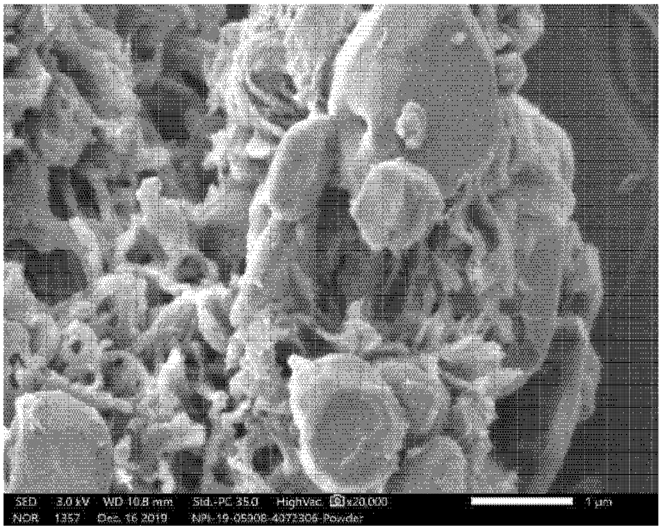

Procedure: The procedure for this Example 20 was substantially the same as that described above for Example 11, with the exception that PPSU was used in place of PEI copolymer, the primary temperature was set to 230° C. instead of 250° C., the mixture was allowed to cool to 23° C. to ensure full precipitation instead of 100° C., and the core-shell particles were dried at 190° C. instead of 200° C. FIG. 23A depicts the Alumina particles, and FIG. 23B depicts the PPSU-Alumina core-shell particles. Certain properties of the resulting dry powder of these PPSU-$Al_2O_3$ core-shell particles were then measured and are included in Tables 1 and 2 below.

21. Example 21: Compression Molded Pellet of PPSU-$Al_2O_3$Core-Shell Particles

Materials: 1.2 g of a dry powder of PPSU-$Al_2O_3$ core-shell particles as produced in Example 20 described above.

Figure 23C:
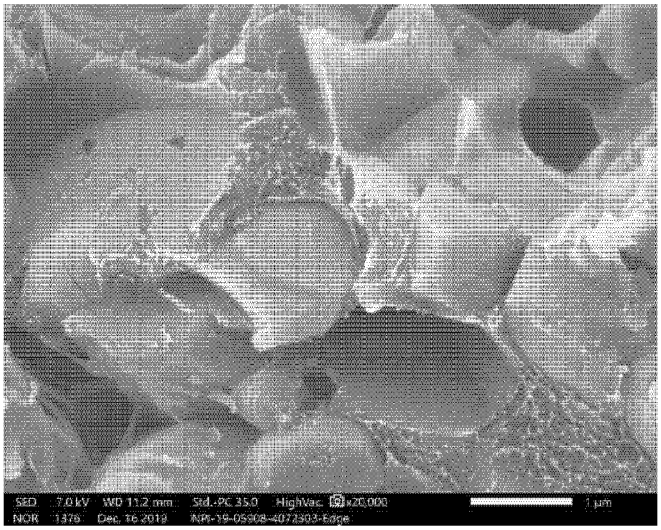

Procedure: The procedure for this Example 21 was substantially the same as that described above for Example 12, with the exception that PPSU-$Al_2O_3$ core-shell particles were used instead of PEI copolymer-ZnO core-shell particles, and the die was heated to a first temperature of 350° C. instead of 260° C. FIG. 23C depicts the microstructure of the compressed pellet, and certain characteristics of the pellets are included in Tables 3 and 4 below.

22. Example 22: Compression Molded Pellet of PPSU-$Al_2O_3$Core-Shell Particles

Materials: 6.572 g of a dry powder of PPSU-$Al_2O_3$ core-shell particles as produced in Example 20 described above.

Procedure: The procedure for this Example 22 was substantially the same as that described above for Example 21, with the exception that a 35 mm die was used instead of a 13 mm die. Certain properties of the resulting PPSU-Alumina pellet were then measured and are included in Table 4 below.

23. Experimental Results

As explained above for certain Examples, various combinations of powders with core-shell particles were produced, and certain processing parameters and properties of the powders are listed in Table 1. As also explained above, the superheat-cool powder-production process was carried out in a PARR™ reactor with reaction pressures less than or equal to 75 psi. With the exception of respective PEI copolymer (CRS5001) and PC copolymer (EXL1463T) reference powders, volume percent of ceramic or inorganic particles were kept at 60% for comparison purpose. The CRS5001 reference powder, designated in Table 1 as "Example 0-A" was made via a process similar to that described above for Example 1, with the exception that ceramic particles were not included in the mixture, CRS5001 particles were included at 10% by volume of the ODCB solvent, agitation proceeded at ~125 rpm instead of ~250 rpm, and it was not necessary to maintain the 250° C. temperature for 30 minutes to facilitate precipitation on ceramic particles. The EXL1463T reference powder, designated in Table 1 as "Example 0-B" was made via a process similar to that described above for Example 4, with the exception that ceramic particles were not included in the mixture, EXL1463T particles were included at 10% by volume of the Xylene solvent, agitation proceeded at ~125 rpm instead of ~250 rpm, and it was not necessary to maintain the 200° C. temperature for 30 minutes to facilitate precipitation on ceramic particles.

Particle size values of the powders were measured with a commercial particle size analyzer (available from Malvern Panalytical Ltd. in Malvern, UK).

Morphology of the particles was also investigated using scanning electron microscopy. FIGS. 14A and 15A respectively show uncoated Alumina particles and uncoated Zirconia particles; FIGS. 14B and 15B respectively show PPO-coated Alumina particles and PPO-coated Zirconia particles; and FIGS. 14C and 15C respectively show the microstructure of PPO-Alumina core-shell particles compression molded into a part and PPO-Zirconia core-shell particles compression molded into a part. PPO coating on the ceramic particles is evident on the core-shell powders in FIGS. 14B and 15B. A thin layer of PPO is also evident between the ceramic grains in FIGS. 14C and 15C. FIG. 17A shows uncoated Alumina particles; FIG. 17B shows PPS-coated Alumina particles; and FIG. 17C shows PPA-Alumina core-shell particles compression molded into a part. PPS coating on the ceramic particles is evident on the core-shell powders in FIG. 17B. A thin layer of PPS is also evident between the ceramic grains in FIG. 17C. FIG. 18A shows uncoated Zinc Oxide particles; FIG. 18B shows PEI copolymer (CRS5001)-coated Zinc Oxide particles; and FIG. 18C shows PEI copolymer (CRS5001)-Zinc Oxide core-shell particles compression molded into a part. PEI

TABLE 1A

Powder Production via Superheat-Cool Process - Process Parameters

| Example | Polymer | Filler | Solvent | PARR Agitation (rpm) | Max Temp. C. | Holding Time, min | Mass Polymer (g) | Mass Ceramic (g) | Polymer/ ceramic vol/vol |
|---|---|---|---|---|---|---|---|---|---|
| PPO ref. | PPO | N/A | MEK | 62 | 140 C | N/A | 10% solids | N/A | N/A |
| 1 | PPO | Alumina | MEK | 250 | 140 C | 30 | 2.66 | 14.93 | 40/60 |
| 2 | PPO | Zirconia | MEK | 250 | 140 C | 30 | 2.66 | 21.38 | 40/60 |
| PPS ref | PPS | N/A | NMP | 125 | 270 C | 30 | 10% solids | N/A | N/A |
| 1 | PPS | Alumina | NMP | 250 | 270 C | 30 | 2.66 | 11.67 | 40/60 |
| 11 (PEI ref) | CRS5001 | N/A | ODCB | 125 | 250 C | N/A | 10% solids | N/A | N/A |
| 11 | CRS5001 | Zinc Oxide | ODCB | 250 | 250 C | 30 | 2.66 | 17.34 | 40/60 |
| 13 | PEEK | Alumina | NMP | 50 | 280 C | 15 | 1.92 | 8.08 | 40/60 |
| 14 | PEEK | Alumina | ODCB | 50 | 280 C | 15 | 1.92 | 8.08 | 40/60 |
| 15 | PEEK | Alumina | ODCB | 250 | 280 C | 30 | 5.76 | 24.24 | 40/60 |
| PPSU ref | PPSU | N/A | ODCB | 50 | 250 C | 15 | 10% solids | N/A | N/A |
| 19 | PPSU | Alumina | ODCB | 50 | 250 C | 15 | 1.95 | 8.05 | 40/60 |
| 20 | PPSU | Alumina | ODCB | 250 | 230 C | 30 | 1.95 | 8.05 | 40/60 |

TABLE 1B

Powder Production via Superheat-Cool Process - Powder Parameters

| Example | Polymer | Filler | Dv10 (μm) | Dv50 (μm) | Dv90 (μm) | Tg (°C) | Tm (°C) | Exotherm (J/g) |
|---|---|---|---|---|---|---|---|---|
| PPO ref | PPO | N/A | 0.163 | 15.4 | 70.3 | 217.71 | 252.2 | 16.9 |
| 1 | PPO | Alumina | 0.026 | 0.13 | 4.49 | 219.85 | N/A | N/A |
| 2 | PPO | Zirconia | 3.71 | 12.7 | 27.8 | 223.06 | N/A | N/A |
| PPS ref | PPS | N/A | 11.9 | 44.6 | 89.8 | N/A | 284.7 | 61.0 |
| 9 | PPS | Alumina | 0.031 | 0.3 | 28.5 | N/A | 279.7 | 11.2 |
| PEI ref | CRS5001 | N/A | 2.75 | 15.3 | 56.4 | 228.7 | 297.9 | 31.6 |
| 11 | CRS5001 | Zinc Oxide | 0.026 | 0.13 | 4.18 | 230.80 | 291.1 | 3.9 |
| 13 | PEEK | Alumina | | | | N/A | 338.4 | 9.7 |
| 14 | PEEK | Alumina | | | | N/A | 338.2 | 10.5 |
| 15 | PEEK | Alumina | 10.4 | 13.3 | 23.9 | N/A | 339.5 | 14.5 |
| PPSU ref | PPSU | N/A | | | | 225.2 | 263.2 | 23.3 |
| 19 | PPSU | Alumina | | | | 227.3 | 261.4 | 4.7 |
| 20 | PPSU | Alumina | 10.1 | 11.4 | 16.6 | 227.5 | 269.0 | 4.234 |

copolymer coating on the ceramic particles is evident on the core-shell powder in FIG. 18B. A thin layer of PEI copolymer is also evident between the ceramic grains in FIG. 18C.

Thermogravimetric analysis (TGA) and molecular weight (measured via GPC) properties for the core-shell powder of Example 1, describe above, are summarized in Table 2. In addition, certain TGA and molecular weight properties were determined for the components of the respective core-shell powders). The density and molecular weight of the respective powders is given as comparative reference. No apparent degradation in molecular weight of the polymer was observed from the present superheating-cooling methods of making core-shell particles.

TABLE 2

Density, TGA, and Molecular Weight Data for Core-Shell Powders

| | Composition | | Density | TGA Polymer | Molecular Weight | | |
|---|---|---|---|---|---|---|---|
| Example | Filler | Polymer | (g/cc) | (wt %) | Mw (Da) | Mn (Da) | PD |
| 1A | $Al_2O_3$ | | 3.95 | 0.23 | N/A | N/A | N/A |
| 1B | | PPO | 1.06 | 99.07 | 44444 | 18066 | 2.6 |
| 1 | $Al_2O_3$ | PPO | | 14.44 | 47432 | 20249 | 2.3 |
| 2A | $ZrO_2$ | | 5.68 | 0.20 | N/A | N/A | N/A |
| 2B | | PPO | 1.06 | 99.07 | 44444 | 18066 | 2.6 |
| 2 | $ZrO_2$ | PPO | | 10.1 | 47871 | 22099 | 2.1 |
| 9A | $Al_2O_3$ | | 3.95 | 0.23 | N/A | N/A | N/A |
| 11A | ZnO | | 5.61 | N/A | N/A | N/A | N/A |
| 11B | | CRS5001 | 1.27 | N/A | 47806 | 18914 | 2.5 |
| 11 | ZnO | CRS5001 | 3.54 | 17.60 | 68001 | 24923 | 2.7 |
| 15 | $Al_2O_3$ | PEEK | 2.83 | 19.38 | — | — | — |
| 19A | $Al_2O_3$ | | 3.95 | 0.23 | N/A | N/A | N/A |
| 19B | | PPSU | 1.40 | 99.85 | 59245 | 22789 | 2.6 |
| 19C | $Al_2O_3$ | PPSU | 2.90 | 19.53 | 57688 | 29033 | 2.0 |
| 20 | $Al_2O_3$ | PPSU | 2.97 | 18.08 | 58382 | 29971 | 1.95 |

TGA and molecular weight (measured via GPC) results on compression molded parts made from the core-shell powders are summarized in Table 3. The density and molecular weight of the polymers parts molded at the same conditions as in Table 2 are given as comparative reference. No apparent degradation in molecular weight of the polymer was observed. However, there was an increase in molecular weight in compression molded PEI copolymer (CRS5001)-coated Zinc Oxide versus neat PEI copolymer that was compression molded at the same condition.

TABLE 3

Density, TGA and Molecular Weight of Pellets of Core-Shell Powders

| | Composition | | Temp/Time/Pres | Density | Relative Density | TGA Polymer | Molecular Weight Mw | Mn | |
|---|---|---|---|---|---|---|---|---|---|
| Example | Filler | Polymer | (°C)/min/ton | (g/cc) | (%) | (wt %) | (Da) | (Da) | PD |
| PPO | | PPO | 270/30/5 | 1.06 | | 100.00 | 50711 | 19294 | 2.6 |
| 3 (270) | $Al_2O_3$ | PPO | 270/30/5 | 2.83 | 91.3 | 15.49 | 64836 | 21108 | 3.1 |
| 3 (300) | $Al_2O_3$ | PPO | 300/30/5 | 2.84 | 94 | 14.54 | 49826 | 15265 | 3.3 |
| PPO | | PPO | 270/30/5 | 1.06 | | 100 | 50711 | 19294 | 2.6 |
| 4 (270) | $ZrO_2$ | PPO | 270/30/5 | 3.88 | 96.4 | 10.64 | 68917 | 22733 | 3 |
| 4 (300) | $ZrO_2$ | PPO | 300/30/5 | 3.81 | 102.3 | 11.27 | 56117 | 17948 | 3.1 |
| 8 | $Al_2O_3$ $ZrO_2$ | PPO | 270/30/5 | 3.32 | 91.5 | 13.75 | 57733 | 14789 | 3.9 |
| 10 | $Al_2O_3$ | PPS | 280/30/5 | 2.75 | 97.6 | 21.52 | | | |
| 12 | ZnO | CRS5001 | 300/30/5 | 3.5 | 102.7 | 15.49 | 66823 | 24126 | 2.77 |
| 16 | $Al_2O_3$ | PEEK | 320/30/5 | 2.81 | 93.7 | 19.87 | — | — | — |
| PPSU | | PPSU | 350/30/5 | 1.3 | | 99.9 | 59245 | 22789 | 2.6 |
| 21 | $Al_2O_3$ | PPSU | 350/30/5 | 2.95 | 99.5 | 18.13 | 46835 | 9697 | 4.83 |

Relative Density was determined by measuring the density of the molded pellet (Measured Density ($\rho_M$)) and comparing that to the Theoretical Density. The Measured Density may be calculated by dividing the volume, determined by measuring the outer dimensions (the volume of other shapes can be determined by any of various known methods, for example by submersion in an incompressible fluid), by the weighing the pellet (determined with a scale or balance). For the present examples, the Measured Density of the samples (e.g., pellets) was determined by the Archimedes method, using a KERN ABS-N/ABJ-NM balance equipped with an ACS-A03 density determination set. In particular, each sample was dried and the dry weight ($W_{dry}$) measured. The sample was then subjected to boiling in water for a period of 1 h to ensure that all voids in the object were filled with the water. The sample when then suspended in the used liquid at a known (non-boiling) temperature to determine the apparent mass in liquid ($W_{sus}$). The sample was then removed from the water, and the excess water wiped from the surface of the sample using a tissue moistened with the water. The saturated sample was then immediately weighed in air ($W_{sat}$). The density was then determined using Formula (2):

$$\text{Density part} = \frac{Wdry}{Wsat - Wsus} * \text{density of water} \quad (2)$$

In the present examples, the quantities of polymer and ceramic in a pellet were known. When the starting proportions are not known, the organic content of the polymer in the compression-molded pellet can be determined by thermogravimetric analysis (TGA) in air, permitting the calculation of the content of ceramic in the compression-molded pellet. The combined density or Theoretical Density ($\rho_T$), assuming zero voids/gas content, was then calculated using Formula (3):

$$\rho_T=((m_p\times\rho_p)+(m_c\times\rho_c))/(m_p+m_c) \quad (3)$$

where $m_p$ is the mass of the polymer in the molded pellet, $\rho_p$ is the density of the polymer, $m_c$ is the mass of the ceramic in the molded pellet, and $\rho_c$ is the density of the ceramic. Relative Density ($\rho_R$) is then calculated according to Formula (4):

$$\rho_R=\rho_M/\rho_T\times100 \quad (4)$$

The measurement of weight changes, programmed as isothermal or linear heating temperature conditions, can be monitored in solid or liquid specimen by the use of a Thermogravimetric Analyzer (TGA). The measurement of weight change, normally weight loss, can result from the degradation (thermal or oxidative) of the specimen, of by the evolution of volatiles below the degradation temperature of the sample. For the TGA measurements discussed herein, less than 50 mg of sample was weighed in a platinum pan, and the TGA test was conducted using a Discovery TGA at hearing rate of 20° C. per minute in air.

Thermal analysis was performed by differential scanning calorimetry (DSC), a method of measuring heat flow as a function of temperature, as well as thermal transitions of samples (e.g., polymers, monomers, and additives) according to a predetermined time and temperature program. These thermal transitions are measured during heating, cooling, or isothermal cycles; and these transitions occur when the material undergoes a physical or chemical change. DSC was carried out on a TA-Q1000 Analyzer at 20 C/min.

The molecular weight measurements reported in Table 2 and Table 3 above, and in Table 4 below, were measured via liquid chromatography using an Agilent 1260 Infinity II HPLC (available from Agilent Technologies, Inc. (Santa Clara, CA, USA)) that comprised an Isocratic Pump, Vialsampler, multi-column thermostat (MCT) to regulate the mobile phase temperature passing through the columns, and a variable wavelength detector (VWD). The system was controlled by Agilent GPC/SEC software, and the measurements performed using known methods.

The measurement of weight changes, programmed as isothermal or linear heating temperature conditions, can be monitored in solid or liquid specimen by the use of a Thermogravimetric Analyzer (TGA). The measurement of weight change, normally weight loss, can result from the degradation (thermal or oxidative) of the specimen, of by the evolution of volatiles below the degradation temperature of the sample. For the TGA measurements discussed herein, less than 50 mg of sample was weighed in a platinum pan, and the TGA test was conducted using a Discovery TGA at hearing rate of 20° C. per minute in air.

Thermal analysis was performed by differential scanning calorimetry (DSC), a method of measuring heat flow as a function of temperature, as well as thermal transitions of samples (e.g., polymers, monomers, and additives) according to a predetermined time and temperature program. These thermal transitions are measured during heating, cooling, or isothermal cycles; and these transitions occur when the material undergoes a physical or chemical change. DSC was carried out on a TA-Q1000 Analyzer at 20 C/min.

Rectangular beams were also cut using a CNC mill from the 50 mm×50 mm×3 mm plaques produced above for Examples 5 and 6 or from the 35 mm pellets produced above for Examples 18 and 22, and certain mechanical properties determined. In particular, beams were cut to have a rectangular cross section of 4 mm×3 mm, and were polished using a 600 grit sand paper and tested under 3-point bending at a 1 mm per minute (mm/min) displacement rate. Table 4 summarizes the measured properties along with reference properties of $Al_2O_3$ alone obtained in literature.

TABLE 4

Mechanical Properties of Compression Molded Parts

| | Molecular Weight | | | Mechanical Properties | | |
|---|---|---|---|---|---|---|
| Example | Mw (Da) | Mw (Da) | Mw (Da) | Flexural Modulus (GPa) | Flexural Strength (MPa) | Flexural Strain (%) |
| 5 | 50029 | 19660 | 2.5 | 2.2 ± 0.08 | 69.2 ± 8.9 | 2.8 ± 0.3 |
| 6 | 67412 | 22837 | 2.6 | 11.8 ± 0.46 | 61.6 ± 1.5 | 0.7 ± 0.02 |
| 18 | — | — | — | 21.2 | 102.4 | 1.072 |
| 22 | 46835 | 9697 | 4.83 | 24.4 | 112.9 | 0.76 |
| $Al_2O_3$ | — | — | — | 350-400 | ~350 | |

In addition to the mechanical properties listed in Table 4, dielectric constant (dk) and dissipation factor (df) were also measured at 1 MHz on 35 mm disks with a thickness of less than 1.01 mm. Table 5 summarizes the measured properties along with reference properties of $Al_2O_3$ alone obtained in literature.

Dielectric permittivity (Dk) and loss tangent or dissipation factor (Df) at different frequencies were determined using the parallel plate configuration defined in the ASTM D150 standard or IPC 2.5.5.9 standard, and split-post dielectric resonator (SPDR), with a non-standard test method. In particular, parallel plate measurements at 1 MHz (ASTM D150) were facilitated by a 16541B test fixture and E4980AL LCR meter (Keysight). The experimental setup included a network analyzer (Agilent Technologies E5071C) connected to the SPDR fixture of choice.

Reported Dk and Df values are the average of 5 measurements with the sample reinserted for each measurement. Test samples were pre-conditioned at room temperature in 50% relative humidity for 24 hours prior to measurements. All sample fixtures were calibrated both in air (empty state) and with a polytetrafluoroethylene (PTFE, kept in 50% humidity environment) control prior to each set of trials. All experiments were conducted at room temperature.

TABLE 5

| Dielectric constant (dk) and dissipation factor (df) at 1 MHz | | |
|---|---|---|
| Example | Dk | Df |
| 5 (PPE only) | 2.77 | 0.0010 |
| 7 (PPE-$Al_2O_3$) | 4.5 | 0.0016 |
| $Al_2O_3$ | 9.8 | 0.0002 |

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this disclosure. As such, the various illustrative embodiments of the methods and systems are not intended to be limited to the particular forms disclosed. Rather, they include all modifications and alternatives falling within the scope of the claims, and embodiments other than the one shown may include some or all of the features of the depicted embodiments. For example, elements may be omitted or combined as a unitary structure, connections may be substituted, or both. Further, where appropriate, aspects of any of the examples described above may be combined with aspects of any of the other examples described to form further examples having comparable or different properties and/or functions, and addressing the same or different problems. Similarly, it will be understood that the benefits and advantages described above may relate to one embodiment or may relate to several embodiments. Accordingly, no single implementation described herein should be construed as limiting and implementations of the disclosure may be suitably combined without departing from the teachings of the disclosure.

The claims are not intended to include, and should not be interpreted to include, means plus- or step-plus-function limitations, unless such a limitation is explicitly recited in a given claim using the phrase(s) "means for" or "step for," respectively.

The invention claimed is:

1. A housing part for a portable electronic device, the housing part comprising:

a housing component comprising ceramic particles in a polymer matrix, the ceramic particles comprising from 50% to 90% by volume of the housing component, and the polymer matrix comprising from 10% to 50% by volume of the housing component;

where the ceramic particles comprise one or more ceramics selected from the group of ceramics consisting of: $Al_2O_3$, $Fe_3O_4$, $Fe_2O_3$, ZnO, $ZrO_2$, $SiO_2$, and combinations of any two or more of these ceramics;

where the polymer matrix comprises a first polymer selected from the group of polymers consisting of: polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), and polyethylene (PE);

where the ceramic particles have a Dv50 of from 50 nanometers to 100 micrometers;

where the ceramic particles are substantially free of agglomeration; and where the housing component has a relative density greater than 90%; and where the housing component is configured to cover a portion of a portable electronic device; and where the polymer matrix is substantially free of semi-crystalline polyamide (SC Polyamide), semi-crystalline polyimide (SC PI), and polyphenylene ether (PPE).

2. The housing part of claim 1, where the ceramic particles comprise between 50% and 70% by volume of the housing component and the ceramic particles comprise one or more ceramics selected from the group of ceramics consisting of: Al2O3, Fe3O4, Fe2O3, ZnO, ZrO2, and combinations of any two or more of these ceramics.

3. The housing part of claim 1, where:

substantially all of the polymer in the polymer matrix is not cross-linked; and the polymer matrix comprises a first polymer selected from the group of polymers consisting of: polyphenylene sulfide (PPS), polycarbonate (PC) copolymers, polyetherimide (PEI), polyetherimide (PEI) copolymers, polyphenylsulfone (PPSU), polyarylethersulfone (PAES), polyether sulfone (PES), polyaryl ether ketone (PAEK), polybutylene terephthalate (PBT), polypropylene (PP), and polyethylene (PE).

4. The housing part of claim 1, further comprising:

an overmolded component comprising a second polymer covering a portion of the housing component.

5. The housing part of claim 4, where a surface of the housing component is covered by the overmolded component, and the covered surface defines protrusions and/or depressions to interface with the overmolded component.

6. The housing component of claim 4, further comprising:

one or more circuit components disposed at least partly between the housing component and the overmolded component.

7. The housing component of claim 6, where the circuit component is selected from the list of circuit components consisting of: a printed circuit board, a wifi antenna, a cellular antenna, an inductive charging circuit, a sensor, and a piezoelectric element, and a haptic feedback element.

8. The housing part of claim 4, where the second polymer comprises a polymer selected from the group of polymers consisting of: PPE, PPS, PC copolymers, PEI, PEI copolymers, PPSU, PAES, PES, PBT, PP, PEE, SC PI, SC polyamide, polyethylene terephthalate (PET), polyoxymethylene (POM), and PC/acrylonitrile butadiene styrene (ABS).

9. The housing part of claim 1, where the housing part defines at least a portion of a watch bezel, phone cover, laptop computer housing, or tablet cover.

10. The housing part of claim 1, where the polymer matrix does not include semi-crystalline polyamide (SC Polyamide).

* * * * *